United States Patent
Enomoto et al.

(10) Patent No.: US 9,349,589 B2
(45) Date of Patent: May 24, 2016

(54) VACUUM PROCESSING APPARATUS AND VACUUM PROCESSING METHOD

(71) Applicant: Tokyo Electron Limited, Tokyo (JP)

(72) Inventors: Tadashi Enomoto, Iwate (JP); Kiichi Takahashi, Iwate (JP); Keiichi Tanaka, Iwate (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 14/591,245

(22) Filed: Jan. 7, 2015

(65) Prior Publication Data

US 2015/0203965 A1 Jul. 23, 2015

(30) Foreign Application Priority Data

Jan. 17, 2014 (JP) ................................ 2014-006911

(51) Int. Cl.

| | |
|---|---|
| *H01L 21/02* | (2006.01) |
| *C23C 16/458* | (2006.01) |
| *C23C 16/44* | (2006.01) |
| *C23C 16/455* | (2006.01) |
| *H01L 21/677* | (2006.01) |
| *H01L 21/687* | (2006.01) |

(52) U.S. Cl.
CPC ........ *H01L 21/0228* (2013.01); *C23C 16/4412* (2013.01); *C23C 16/4584* (2013.01); *C23C 16/45551* (2013.01); *H01L 21/67748* (2013.01); *H01L 21/68742* (2013.01); *H01L 21/68764* (2013.01); *H01L 21/68771* (2013.01)

(58) Field of Classification Search
CPC ..................... H01L 21/0228; H01L 21/68771; H01L 21/68764; H01L 21/67748; H01L 21/68742; C23C 16/45551; C23C 16/4584; C23C 16/4412

See application file for complete search history.

(56) References Cited

U.S. PATENT DOCUMENTS

| | | | | |
|---|---|---|---|---|
| 8,034,732 | B2 * | 10/2011 | Kobayashi ............. | A01N 59/16 424/617 |
| 2001/0007244 | A1 * | 7/2001 | Matsuse ............ | C23C 16/45519 118/719 |
| 2006/0073276 | A1 * | 4/2006 | Antonissen ......... | C23C 16/4412 427/248.1 |
| 2007/0218702 | A1 * | 9/2007 | Shimizu .................. | C23C 16/06 438/758 |

FOREIGN PATENT DOCUMENTS

JP 2011-151387 8/2011

* cited by examiner

*Primary Examiner* — John P Dulka
(74) *Attorney, Agent, or Firm* — IPUSA, PLLC

(57) ABSTRACT

A vacuum processing apparatus is configured to include a process chamber, a turntable provided in the process chamber, and a substrate receiving area provided in one surface of the turntable and including a regulation part formed therearound to regulate a position of a substrate. A transfer mechanism is provided outside the process chamber, and a lifting member is configured to support the substrate and to move up and down in order to transfer the substrate between the transfer mechanism and the turntable. An exhaust mechanism is configured to selectively evacuate a gap between the substrate receiving area and the substrate before the lifting member places the substrate on the substrate receiving area.

18 Claims, 18 Drawing Sheets

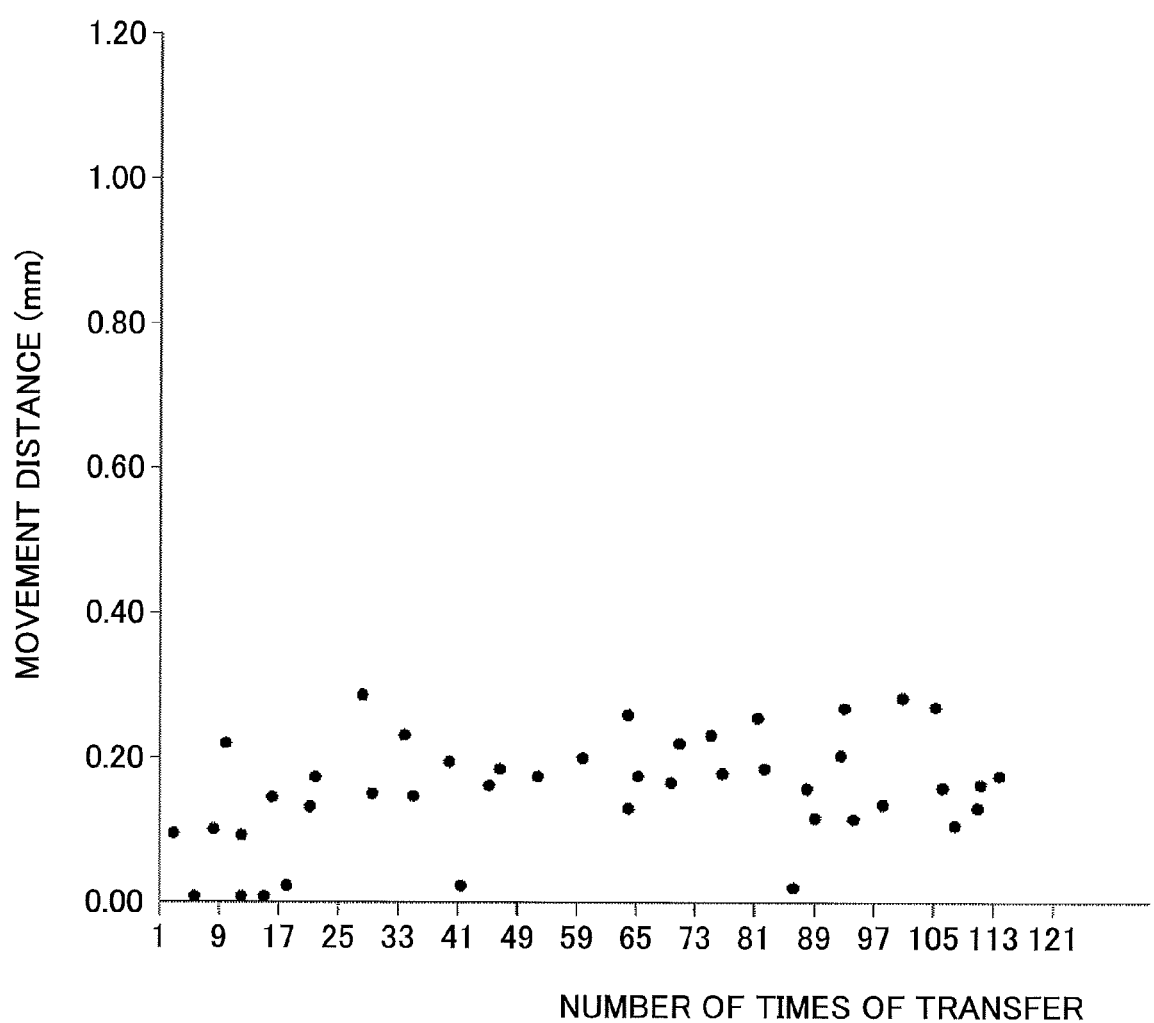

VACUUM PROCESSING APPARATUS AND VACUUM PROCESSING METHOD

CROSS-REFERENCE TO RELATED APPLICATIONS

This patent application is based upon and claims the benefit of priority of Japanese Patent Application No. 2014-6911, filed on Jan. 17, 2014, the entire contents of which are incorporated herein by reference.

BACKGROUND OF THE INVENTION

1. Field of the Invention

The present invention relates to a vacuum processing apparatus and a vacuum processing method for processing a substrate by supplying a gas into a process chamber under a vacuum atmosphere.

2. Description of the Related Art

A film deposition apparatus that performs an ALD (Atomic Layer Deposition) method disclosed in Japanese Laid-Open Patent Application Publication No. 2011-151387 is, for example, known as an apparatus and a method to deposit a thin film such as a silicon oxide $SiO_2$) film on a substrate such as a semiconductor wafer (which is hereinafter called a "wafer"). The film deposition apparatus includes a horizontal turntable in a process chamber that is evacuated and made a vacuum atmosphere, and the turntable includes a plurality of concave portions in which a wafer is accommodated in a circumferential direction of the turntable. A plurality of gas nozzles is arranged so as to face the turntable. For example, the plurality of gas nozzles include gas nozzles for forming processing atmospheres by supplying process gases (reaction gases) in order to deposit a silicon oxide film, and gas nozzles for supplying a separation gas that separates the processing atmospheres from each other above the turntable. The gas nozzles for supplying the process gases and the gas nozzles for supplying the separation gas are alternately arranged above the turntable in the process chamber.

The film deposition apparatus includes lifting pins movable up and down so as to penetrate a bottom of the concave portions. A wafer transferred by a transfer mechanism is supported by the tops of the lifting pins. The wafer is transferred to the bottom of each of the concave portions by intermittently rotating the turntable and by moving the lifting pins up and down.

In the meantime, when transferring the wafer from the transfer mechanism into the concave portion in this manner, it is noted that the wafer is sometimes placed in a position that is shifted from a position where the wafer should be placed normally. This is thought to be due to a gas that remains in the concave portion even though the inside of the process chamber is made a vacuum atmosphere when transferring the wafer. More specifically, when the wafer is lowered toward the bottom of the concave portion in a state in which the gas is left inside the concave portion, the wafer does not contact the bottom of the concave portion due to the remaining gas, goes into a state of floating, and moves laterally by sliding.

Moreover, the wafer transferred by the transfer mechanism to the turntable sometimes has warpage. Furthermore, even when the wafer does not have warpage during the transfer by the transfer mechanism, the wafer may warp due to a non-uniform temperature within a surface of the wafer caused by heat received from the turntable when lowering toward the bottom of the concave portion. When such a warped wafer floats up due to the gas inside the concave portion and moves laterally, a periphery of the wafer is liable to run on an edge of the concave portion. In addition, when the turntable is rotated in such a state, the wafer comes out of the concave portion by a centrifugal force due to the rotation and an air current formed in the process chamber, and a normal film deposition process is unlikely to be performed on the wafer. Japanese Laid-Open Patent Application Publication No. 2011-151387 does not disclose any measure to solve such a problem.

SUMMARY OF THE INVENTION

Embodiments of the present invention provide a vacuum processing apparatus and a vacuum processing method solving one or more of the problems discussed above.

More specifically, the embodiments of the present invention may provide a vacuum processing apparatus and a vacuum processing method that perform a process by forming a vacuum atmosphere and supplying a gas to a substrate and can prevent the substrate from being placed in a position out of a receiving area of a turntable when the substrate is placed on the receiving area.

According to one embodiment of the present invention, there is provided a vacuum processing apparatus that includes a process chamber to be evacuated to have a vacuum atmosphere thereinside, a turntable provided in the process chamber, a substrate receiving area provided in one surface of the turntable and including a regulation part formed therearound to regulate a position of the substrate, and a gas supply part to supply a process gas to a substrate on the turntable. A transfer mechanism is provided outside the process chamber and configured to transfer the substrate into the process chamber, and a lifting member is configured to support the substrate and to move up and down in order to transfer the substrate between the transfer mechanism and the turntable. An exhaust mechanism is configured to selectively evacuate a gap between the substrate receiving area and the substrate before the lifting member places the substrate on the substrate receiving area.

According to another embodiment of the present invention, there is provided a vacuum processing method. In the method, a process chamber is evacuated to form a vacuum atmosphere inside the process chamber, and a substrate receiving area including a regulation part formed therearound to regulate a position of the substrate provided in one surface of a turntable provided in the chamber is rotated by rotating the turntable. Next, a lifting member supporting the substrate is moved up and down to transfer the substrate between a substrate transfer mechanism and the turntable, and a process gas is supplied from a gas supply part to the substrate on the turntable. A gap between the substrate receiving area and the substrate is evacuated by an exhaust mechanism before the substrate is placed on the substrate receiving area by the lifting member.

Additional objects and advantages of the embodiments are set forth in part in the description which follows, and in part will become obvious from the description, or may be learned by practice of the invention. The objects and advantages of the invention will be realized and attained by means of the elements and combinations particularly pointed out in the appended claims. It is to be understood that both the foregoing general description and the following detailed description are exemplary and explanatory and are not restrictive of the invention as claimed.

BRIEF DESCRIPTION OF THE DRAWINGS

FIG. 15 is a timing chart illustrating a height of the lifting pins, evacuation timing and the like;

FIG. 21 is a graph showing a result of an evaluation test.

DETAILED DESCRIPTION OF THE PREFERRED EMBODIMENTS

A description is given below of embodiments of the present invention, with reference to accompanying drawings.

First Embodiment

Figure 1:
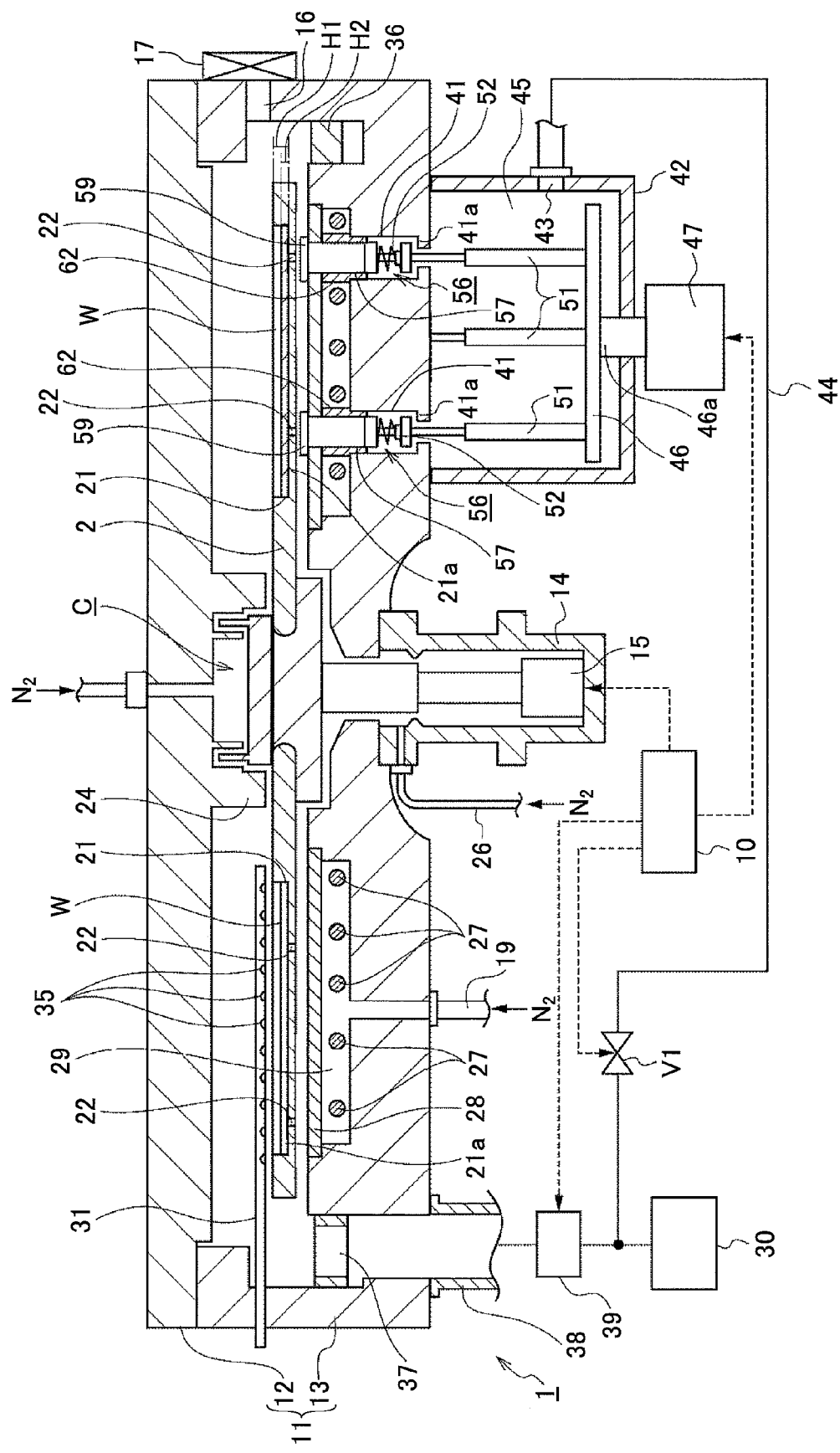
FIG. 1 is a vertical cross-sectional view of a film deposition apparatus to which a vacuum processing apparatus according to an embodiment of the present invention is applied.
Figure 2:
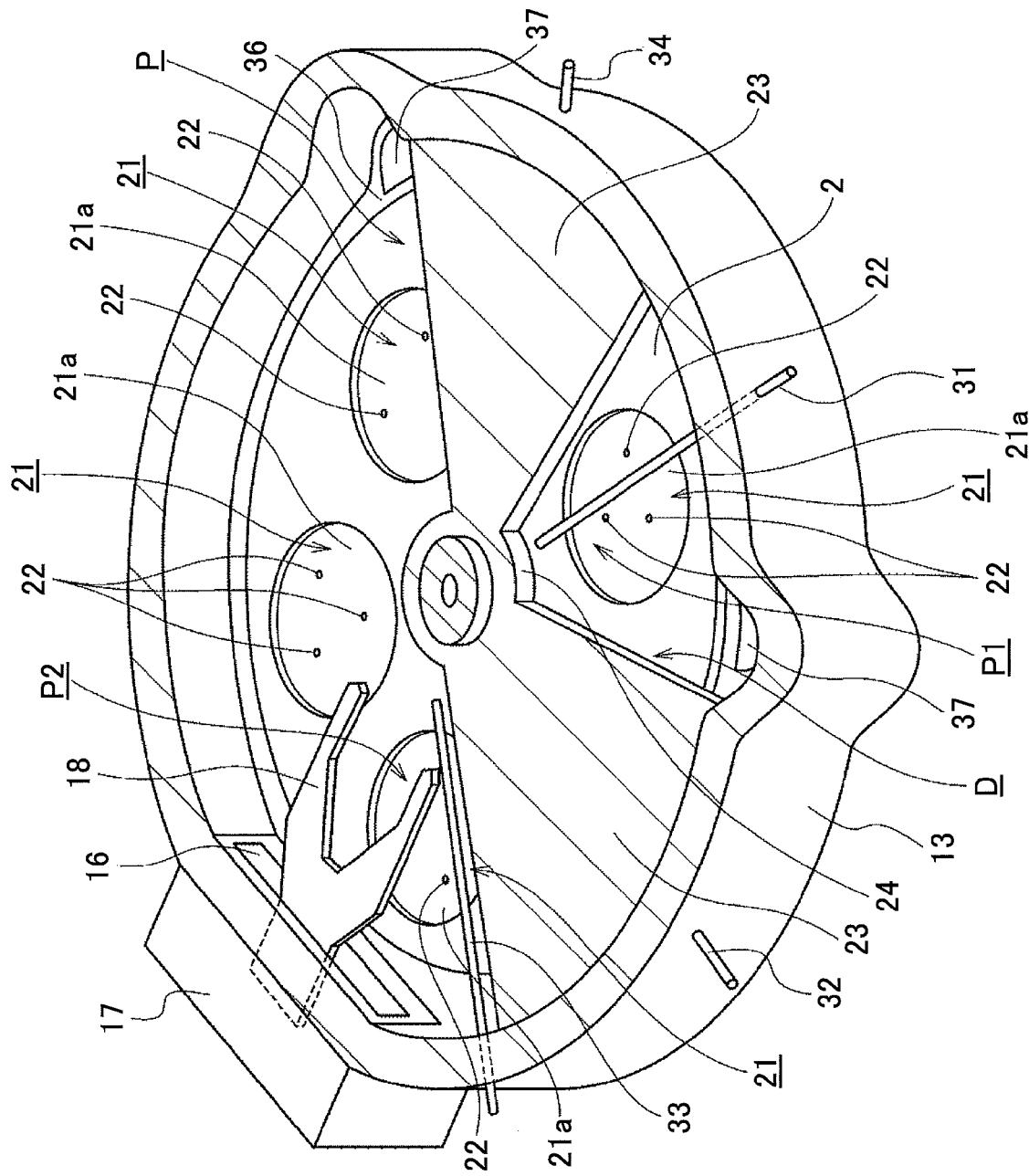
FIG. 2 is a perspective view illustrating a schematic inner configuration of the film deposition apparatus.
Figure 3:
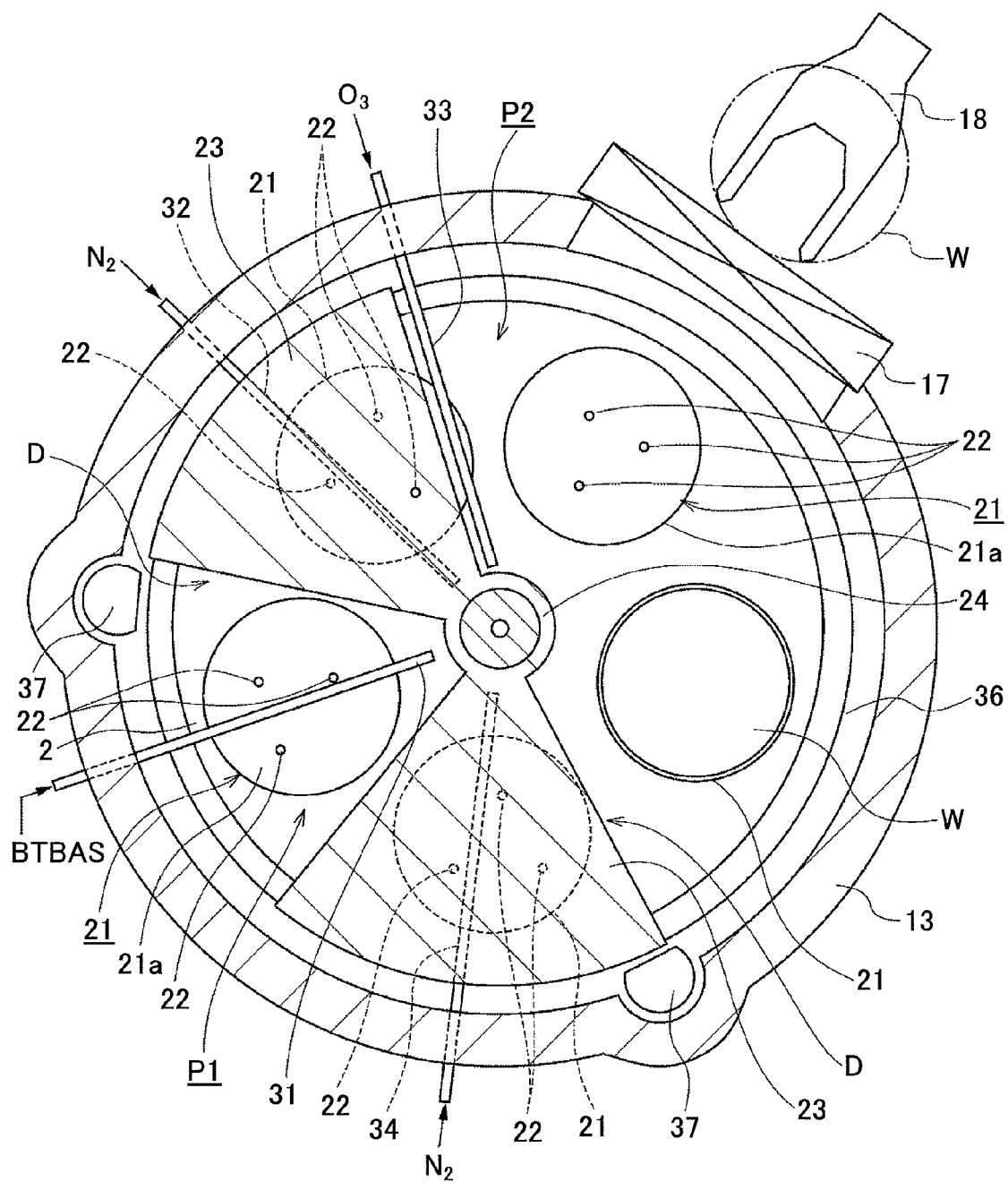
FIG. 3 is a horizontal section plan view illustrating the film deposition apparatus.

A description is given below of a film deposition apparatus 1 for performing ALD on a wafer W that is a substrate, which is an embodiment of a vacuum processing apparatus of the present invention, with reference to FIGS. 1 through 3. FIG. 1 is a vertical cross-sectional view of the film deposition apparatus 1, and FIG. 2 is a schematic perspective view illustrating the inside of the film deposition apparatus 1. FIG. 3 is a horizontal section plan view of the film deposition apparatus 1. The film deposition apparatus 1 includes a flattened vacuum chamber (process chamber) 11 having an approximately round planar shape, and a disk-shaped horizontal turntable 2 provided in the vacuum chamber 11. The vacuum chamber 11 is constituted of a ceiling plate 12 and a chamber body 13 that forms a side wall and a bottom of the vacuum chamber 11. As illustrated in FIG. 1, a cover 14 that covers a central part on the underside of the chamber body 13 is provided.

The turntable 2 that forms a stage of a wafer W is connected to a rotary drive mechanism 15, and rotates around a central axis thereof in a circumferential direction by the rotary drive mechanism 15. Five circular concave portions 21 are formed in a surface on the upper surface side (one surface side) of the turntable 2 in a rotational direction thereof, and the wafers W that are substrates are placed on bottom surfaces 21a of the concave portions 21. More specifically, the concave portions 21 constitute receiving areas of the wafers W, and sidewalls of the concave portions 21 constitute regulation parts that regulate positions of the wafers W. The wafers W accommodated in the concave portions 21 rotate around the central axis of the turntable 2 by the rotation of the turntable 2. In FIG. 1, a height H1 of the concave portions 21 and a thickness H2 of the wafers W are, for example, 1.8 mm and 0.8 mm, respectively. Three through holes 22 that penetrate through the turntable 2 in a thickness direction are formed in the bottom surface 21a of each of the concave portions 21. The through holes 22 serve both as gas suction paths for evacuating the concave portions 21 and as migration paths for lifting pins 51 described later.

A transfer opening 16 is opened in a side wall of the vacuum chamber 11, and is configured to be openable and closeable by a gate valve 17. A wafer transfer mechanism 18 outside the film deposition apparatus 1 can enter the vacuum chamber 11 through the transfer opening 16. The wafer transfer mechanism 18 transfers the wafer W to the concave portion 21 facing the transfer opening 16.

As illustrated in FIGS. 2 and 3, above the turntable 2, a first reaction gas nozzle 31, a separation gas nozzle 32, a second reaction gas nozzle 33 and a separation gas nozzle 34 that extend from an outer periphery toward the center of the turntable 2 and have a rod-like shape, respectively, are arranged in a circumferential direction in this order. These gas nozzles 31 through 34 have holes 35 in lower surfaces thereof, and supply gases along a radius of the turntable 2, respectively. The first reaction gas nozzle 31 discharges BTBAS (Bis(tertiary-butyl-amino)silane) gas, and the second reaction gas nozzle 33 discharges $O_3$ (ozone) gas, respectively. The separation gas nozzles 32 and 34 discharge $N_2$ (nitrogen) gas.

The ceiling plate 12 of the vacuum chamber 11 includes two sectorial convex portions 23 protruding downward, and the convex portions 23 are formed at intervals in the circumferential direction. The separation gas nozzles 32 and 34 are provided so as to cut into the convex portions 23 and to divide the convex portions 23 into two in the circumferential direction, respectively. The first reaction gas nozzle 31 and the second reaction gas nozzle 33 are provided apart from each of the convex portions 23. A gas supply area under the first reaction gas nozzle 31 is made a first process area P1, and a gas supply area under the second reaction gas nozzle 33 is made a second process area P2. Areas under the convex portions 23 are formed as separation areas D.

A ring plate 36 is provided at the bottom of the vacuum chamber 11 and outside the turntable 2 in the radius direction thereof, and the ring plate 36 has exhaust openings 37 opened at intervals in a circumferential direction thereof. An end of an exhaust pipe 38 is connected to each of the exhaust openings 37. The other end of each of the exhaust pipes 38 joins together and is connected to an exhaust mechanism 30 constituted of a vacuum pump by way of an exhaust gas amount adjustment mechanism 39. The exhaust gas amount adjustment mechanism 39 adjusts an amount of exhaust gas from each of the exhaust openings 37, thereby adjusting a pressure inside the vacuum chamber 11.

The vacuum chamber 11 is configured to be able to supply N$_2$ gas into a space above a central area C of the turntable 2. N$_2$ gas supplied into the space above the central area C flows outward of the turntable 2 in the radius direction thereof as a purge gas by way of a flow passage under a ring-shaped protrusion portion 24 protruding downward in a ring shape in the central part of the ceiling plate 12. A lower surface of the ring-shaped protrusion portion 24 is configured to be continuously connected to lower surfaces of the convex portions 23 that form the separation areas D.

As illustrated in FIG. 1, a supply pipe 26 is provided for supplying N$_2$ gas to a location under the turntable 2 as a purge gas. A depression part is formed that constitutes a heater accommodation space 29 along the rotational direction of the turntable 2 in the bottom surface of the chamber body 13 under the turntable 2, and a heater 27 is provided in the heater accommodation space 29 in a concentric fashion. Radiation heat from the heater 27 heats the turntable 2, thereby heating the wafer W. A plate 28 is provided so as to cover the depression part forming the heater accommodation space 29 from above, and the heater accommodation space 29 is separated by the plate 28 from an atmosphere to which the reaction gases are supplied. As illustrated in FIG. 1, a supply pipe 19 for supplying N$_2$ gas to the heater accommodation space 29 is provided.

A further description is given below of a configuration of the bottom part of the chamber body 13 and surroundings thereof. Three openings 41 that penetrate through the bottom part in the thickness direction are formed (only two of the openings 41 are illustrated in FIG. 1 as a matter of convenience). A flat cylindrical body 42 having a bottom is provided on the lower side of the bottom part of the chamber body 13. Each of the openings 41 overlaps with each of the through holes 22 of the concave portions 21 when the wafer W is transferred between the wafer transfer mechanism 18 and the concave portion 21 of the turntable 2.

An upper end of the cylindrical body 42 that is a partition member surrounds three of the openings 41 and is provided in close contact with the bottom part of the chamber body 13. An end of an exhaust pipe 44 is connected to an exhaust hole 43 provided in a side wall of the cylindrical body 42 from the outside. The other end of the exhaust pipe 44 is connected to the downstream side of the exhaust gas amount adjusting mechanism 39 of the exhaust pipe 38 through a valve V1, and an exhaust space 45 surrounded by the cylindrical body 42 can be evacuated by opening the valve V1.

A horizontal plate 46 is provided in the exhaust space 45, and a projection part 46a that penetrates through the bottom part of the cylindrical body 42 is provided under the horizontal plate 46. The projection part 46a is connected to a drive mechanism 47 outside the cylindrical body 42. The horizontal plate 46 moves up and down by the drive mechanism 47, which causes tips of the lifting pins 51 described later to move up and down between a location inside of the openings 41 and a location above the turntable 2.

Three of the lifting pins 51 extending in a vertical direction are provided as an elevating member on the horizontal plate 46. A description is given below of the lifting pins 51, also referring to FIGS. 4 and 5 that are a side view and a perspective view thereof, respectively. For the purpose of illustration, in FIG. 5, the lifting pins 51 are illustrated by being drawn out of the bottom part of the chamber body 13 in an upward manner. A base part 51a of the lifting pin 51 has a diameter larger than that of a tip part 51b of the lifting pin 51 so as to form a step part in the lifting pin 51 when seen from a lateral side. The tip part 51b is provided so as to enter the opening 41 in the bottom part of the chamber body 13, and a flange 52 that forms an engagement part is provided in the tip part 51b. In this example, the flange 52 is formed to have a circular shape a part of which including an outer periphery is cut away when seen in a plan view.

A lower end of the opening 41 has a diameter smaller than that of the other part of the opening 41 so as to form a step part 41a, and a lower ring member 53 is provided in a space 41b above the step part 41a. An upper ring member 54 is provided above the lower ring member 53, and a coiled spring 55 lies between the ring members 53 and 54. The ring members 53 and 54 and the coiled spring 55 constitute an energizing mechanism 56, and forms a moving mechanism to move a pipe 57 described later. Moreover, as described later, the energizing mechanism 56 moves up and down in conjunction with the rise and fall of the lifting pin 51, and operates so as to energize the pipe 57 toward the turntable 2. The lower ring member 53 forms an engagement member to engage with the flange 52 of the lifting pin 51.

Outer diameters of these ring members 53 and 54 are formed to be smaller than an inner diameter of the space 41b so that the ring members 53 and 54 can move up and down in the space 41b above the step part 41a. The tip part 51b of the lifting pin 51 is provided so as to penetrate through these ring members 53 and 54 and to pass the axis of the coiled spring 55, and the flange 52 of the lifting pin 51 is located on the lower ring member 53. As described later, an opening diameter of the lower ring member 53 is formed to be smaller than an outer diameter of the flange 52 and a diameter of the base part 51a of the lifting pin 51 so that the lower ring member 53 can move up and down by the rise and fall operation of the lifting pin 51.

As described in FIG. 4, a ring member 61 is provided to connect the pipe 57 described later with the upper ring member 54, and so as to protrude from the inner surface of an upper end of the upper ring member 54 to a location above the upper ring member 54. The opening diameter of the upper ring member 54 and the opening diameter of the ring member 61 are formed to be larger than the outer diameter of the flange 52, and the flange 52 can move from the lower side of the upper ring member 54 to the upper side of the ring member 61.

Figure 4:
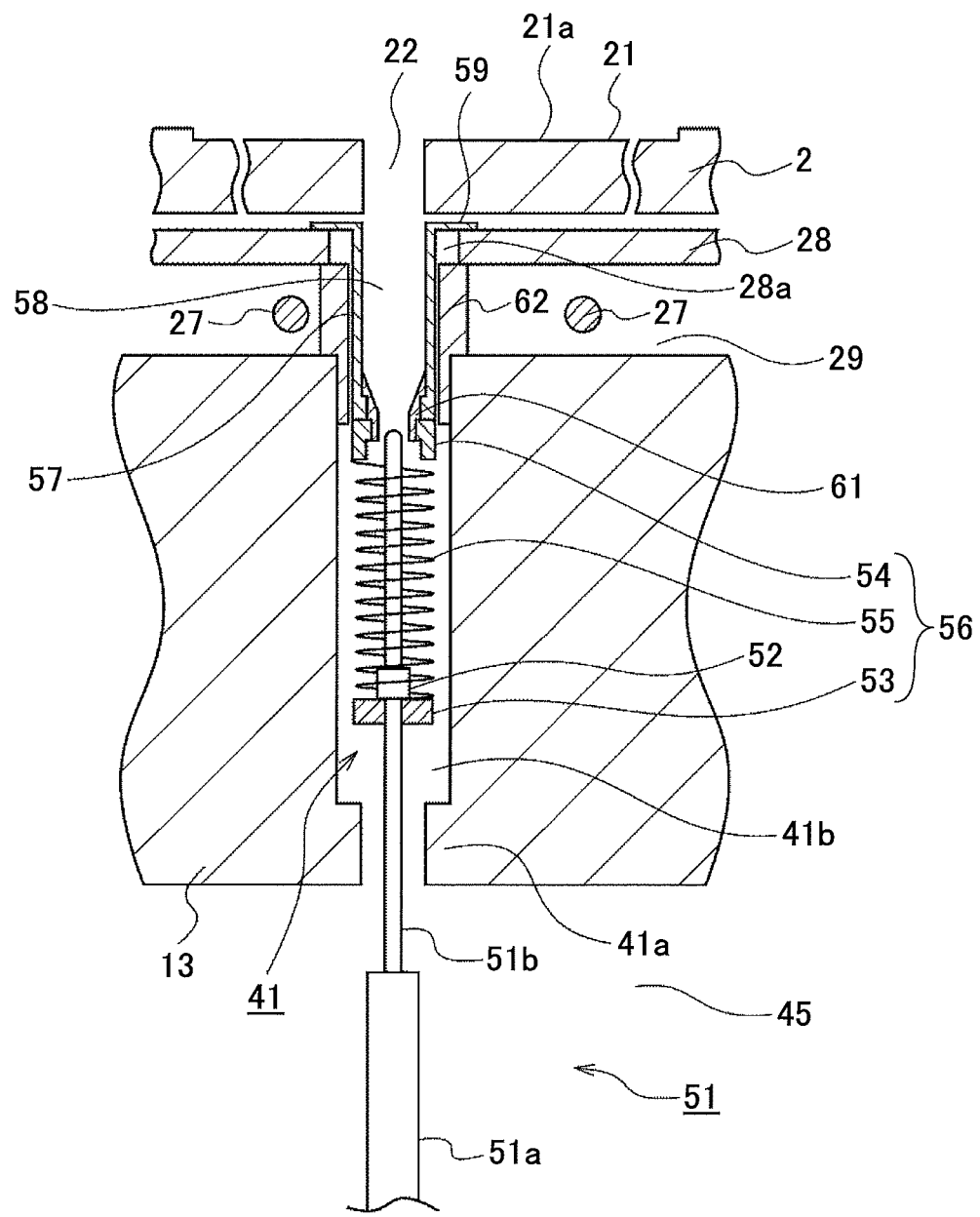
FIG. 4 is a vertical cross-sectional side view illustrating a bottom of a vacuum chamber of the film deposition apparatus.
Figure 5:
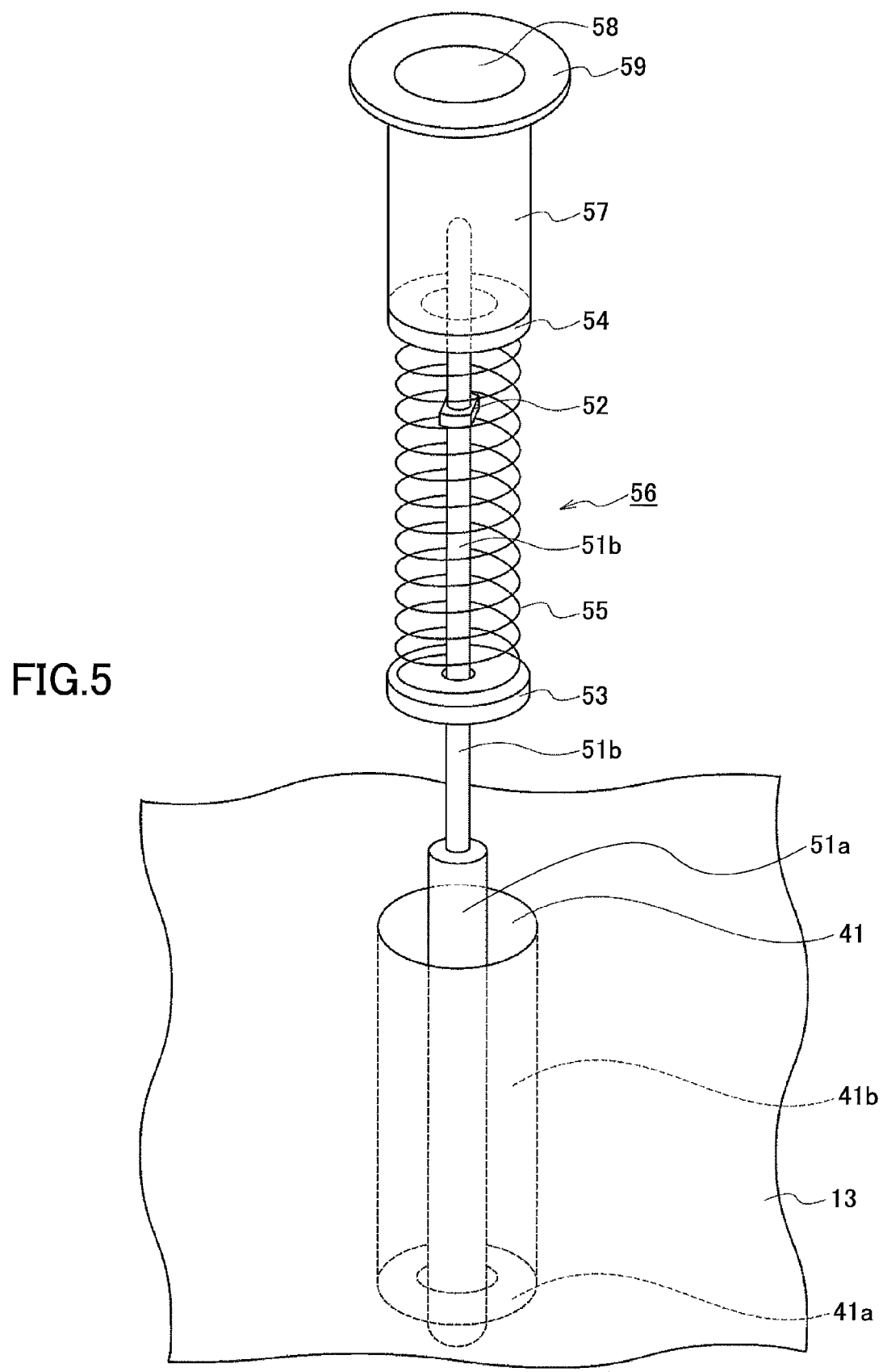
FIG. 5 is a perspective view illustrating a lifting pin provided in the bottom of the vacuum chamber.
Figure 6:
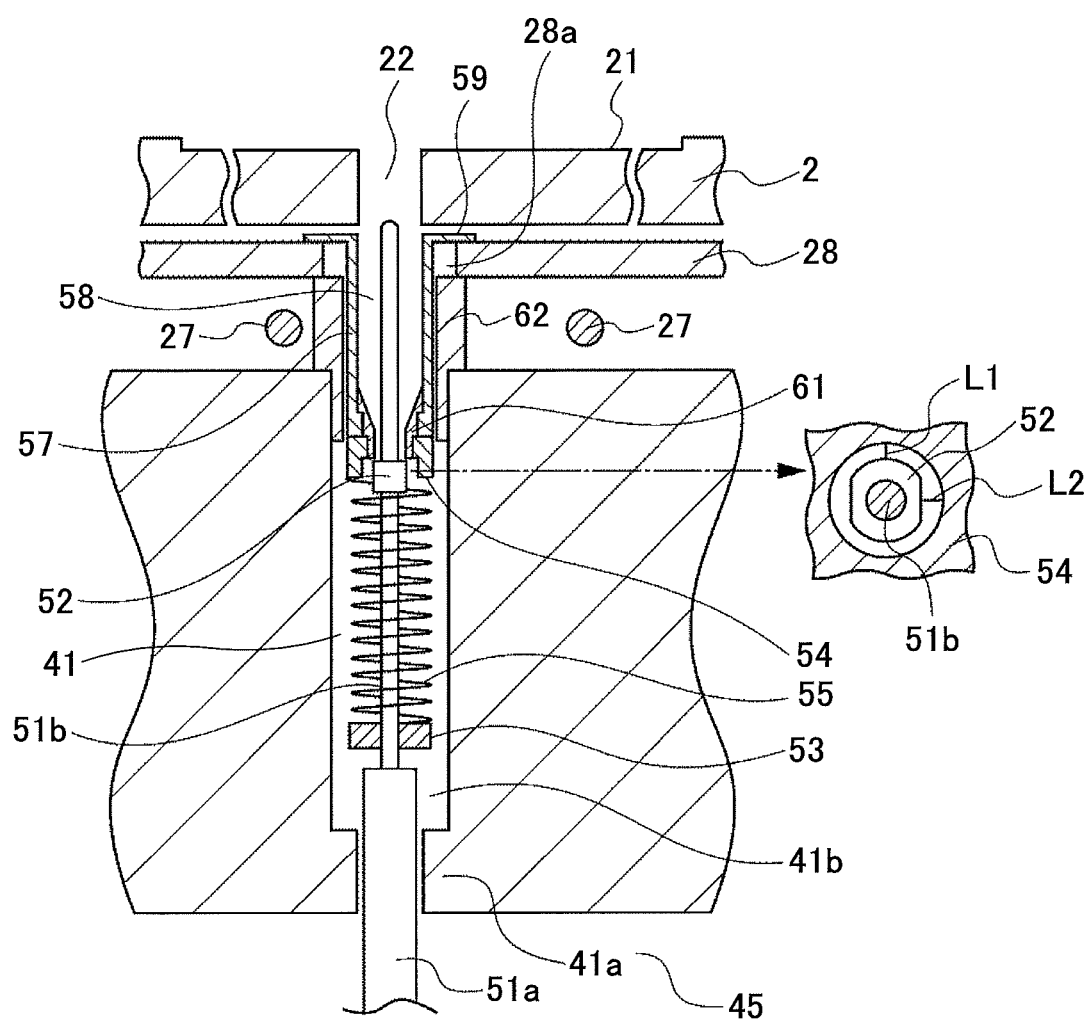
FIG. 6 is a first explanation drawing illustrating operation of the lifting pin.

FIG. 6 illustrates a state of the flange 52 passing the opening of the upper ring member 54 after the lifting pin 51 moves up from the state illustrated in FIG. 4. In FIG. 6, a horizontal cross section of the upper ring member 54 in this state is illustrated in a location indicated by an arrow with a chain line, in which a shortest distance between the flange 52 and a side wall of the opening is indicated by L1, and a longest distance between the flange 52 and the side wall of the opening is indicated by L2. In this example, L1 is set at 1.0 mm, and L2 is set at 1.3 mm.

The cylindrical pipe 57 that forms a flow passage forming member is provided extending upward from the upper end of the upper ring member 54 so as to penetrate a hole 28a formed in the plate 28 above the heater 27. The pipe 57 is provided so as to surround the ring member 61 from the outside, and the inside of the pipe 57 forms a flow passage 58 of a gas. The upper end of the pipe 57 extends outward in a space between the plate 28 and the turntable 2, and forms a flange 59.

A separating tube 62 that forms a cylinder is provided between the plate 28 and the bottom part of the chamber body 13 of the vacuum chamber 11. The upper end of the separating tube 62 contacts an opening edge of the hole 28a in the plate 28, and is provided along the opening edge. The lower end of the separating tube 62 is formed so as to go into the opening 41. The separating tube 62 serves to prevent a gas flowing from the through hole 22 into the heater accommodation space 29 and to prevent the heater 27 from deteriorating (see FIG. 1). An inner diameter of the separating tube 62 is formed to be slightly larger than an outer diameter of the pipe 57 to allow the pipe 57 to move up and down in the separating tube 62.

When the wafer W is transferred between the wafer transfer mechanism 18 and the concave portion 21 of the turntable 2, the lifting pins 51 move up and down in a state in which the through holes 22 of the concave portion 21 overlap with the openings 41 of the chamber body 13, and the tip parts 51b of the lifting pins 51 protrude and sink in an area above the through holes 22. In this manner, when a height position of the lifting pins 51 in a standby state before transferring the wafer W is arranged at a home position, FIG. 4 illustrates the lifting pin 51 positioned at the home position. Thus, when the lifting pin 51 is positioned at the home position, the flange 59 of the pipe 57 is apart from the back surface of the turntable 2.

Figure 7:
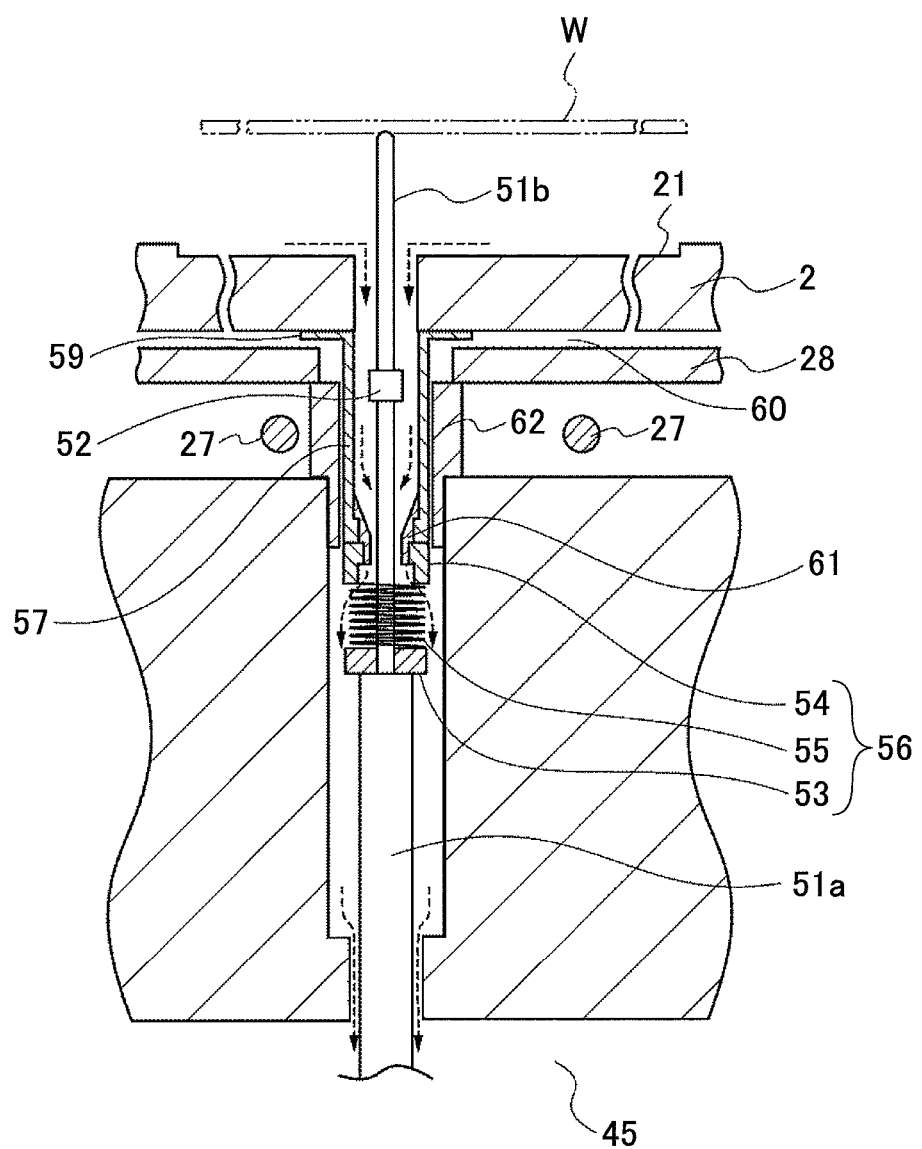
FIG. 7 is a second explanation drawing illustrating the operation of the lifting pin.

A description is given below of an operation of the pipe 57 and the energizing mechanism 56 when the lifting pin 51 moves up and down. When the lifting pin 51 moves up from the home position in FIG. 4 to transfer the wafer W to the wafer transfer mechanism 18, as illustrated in FIG. 6, the flange 52 passes the upper ring member 54, and the lifting pin 51 further moves up. Then, the tip part 51b of the lifting pin 51 protrudes from the turntable 2, and the upper end of the base part 51a of the lifting pin 51 contacts the lower ring member 53 and pushes the energizing mechanism 56 including the lower ring member 53, the ring member 61 and the pipe 57. This causes the flange 59 of the pipe 57 to contact the edge of the through hole 22 of the back surface of the turntable 2, thereby connecting the flow passage 58 formed by the pipe 57 to the through hole 22 of the turntable 2. When the lifting pin 51 further moves up and the lower ring member 53 moves up, the coiled spring 54 contracts and the flange 59 is energized and adheres tightly to the turntable 2. After that, the lifting pin 51 stops moving up, and begins moving down. FIG. 7 illustrates a state of the lifting pin 51 at the start of its descent.

As described later, when the lifting pin 51 lies at a position above the home position (standby position), the exhaust space 45 is evacuated to remove a gas inside the concave portion 21 of the turntable 2. At this time, because the flange 59 of the pipe 57 is in close contact with the turntable 2, the flow passage 58 inside the pipe 57 is separated from an external space 60 (see FIG. 7) of the pipe 57 under the turntable 2. Accordingly, by evacuating the exhaust space 45, the inside of the concave portion 21 can be selectively evacuated without evacuating the external space 60. The gas inside the concave portion 21 flows through the through hole 22 of the turntable 2, the flow passage 58, the opening 41 and the exhaust space 45 in this order and is removed by the selective evacuation. In FIG. 7, exhaust flows by this gas is illustrated by directional dashed lines. The pipe 57, the opening 41, the cylindrical body 42 and the valve V1 constitute an exhaust mechanism to evacuate in this manner.

When the lifting pin 51 moves down from the state of FIG. 7, the lower ring member 53 supported by the base part 51a of the lifting pin 51 moves down with the lifting pin 51, and the coiled spring 55 extends. When the coiled spring 55 extends to the end, the bias of the pipe 57 to the turntable 2 is released, and a state of the pipe 57 in close contact with the turntable 2 is released. When the lifting pin 51 further moves down, the pipe 57, the ring member 61 and the energizing mechanism 65 move down by gravity while being supported by the lifting pin 51. The flange 59 of the pipe 57 becomes apart from the back surface of the turntable 2, and the connection between the flow passage 58 of the pipe 57 and the though hole 22 of the turntable 2 is released. Then, when the flange 59 is supported on the plate 28, the pipe 57, the ring member 61 and the energizing mechanism 56 stop falling. The lifting pin 51 further moves down and stops at the home position. In other words, the lifting pin 51, the ring member 61, the energizing mechanism 56 and the pipe 57 stop at positions illustrated in FIG. 4.

As described above, when the lifting pin 51 moves down, for example, it is assumed that the pipe 57 and the separating tube 62 are in contact with each other and that the flange 59 of the pipe 57 stands still in contact with the turntable 2 by friction between the pipe 57 and the separating tube 62. That is to say, a description is given below of a case in which the lower ring member 53 separates from the base part 51a of the lifting pin 51 and only the lifting pin 51 moves down to the home position. In this case, the flange 52 of the lifting pin 52 contacts the lower ring member 53 of the energizing mechanism 56 (see FIG. 8) and pushes the lower ring member 53 downward. The upper ring member 51 is pulled down by a tensile force of the coiled spring 55, and the flange 59 separates from the turntable 2. This enables each of the lifting pin 51, the ring member 61, the energizing mechanism 56 and the pipe 57 to move the position illustrated in FIG. 4.

The film deposition apparatus 1 includes a control unit 10 configured to control the operation of the entire apparatus and constituted of a computer. The control unit 10 stores a program for executing the transfer of the wafer W between the film deposition apparatus 1 and the transfer mechanism 18. The control unit 10 sends a control signal to each part of the film deposition 1 by running the program.

More specifically, the control unit 10 controls each operation such as the supply and stop of each gas from a gas supply source not illustrated in the drawings to each of the gas nozzles 31 through 34 and the central area C, the control of the rotational speed of the turntable 2 by the rotary drive mechanism 15, the adjustment of the amount of exhaust gas from each of the vacuum exhaust openings 37 by the exhaust gas amount adjustment mechanism 39, the rise and fall of the lifting pins 51 by the drive mechanism 47 and the like. In the program, a group of steps is organized to control such an operation and to execute each process described later. The program is installed into the control unit 10 from a storage medium such as a hard disk, a compact disc, a magnetic optical disk, a memory card and a flexible disk and the like can be used as the medium 103.

Figure 14:
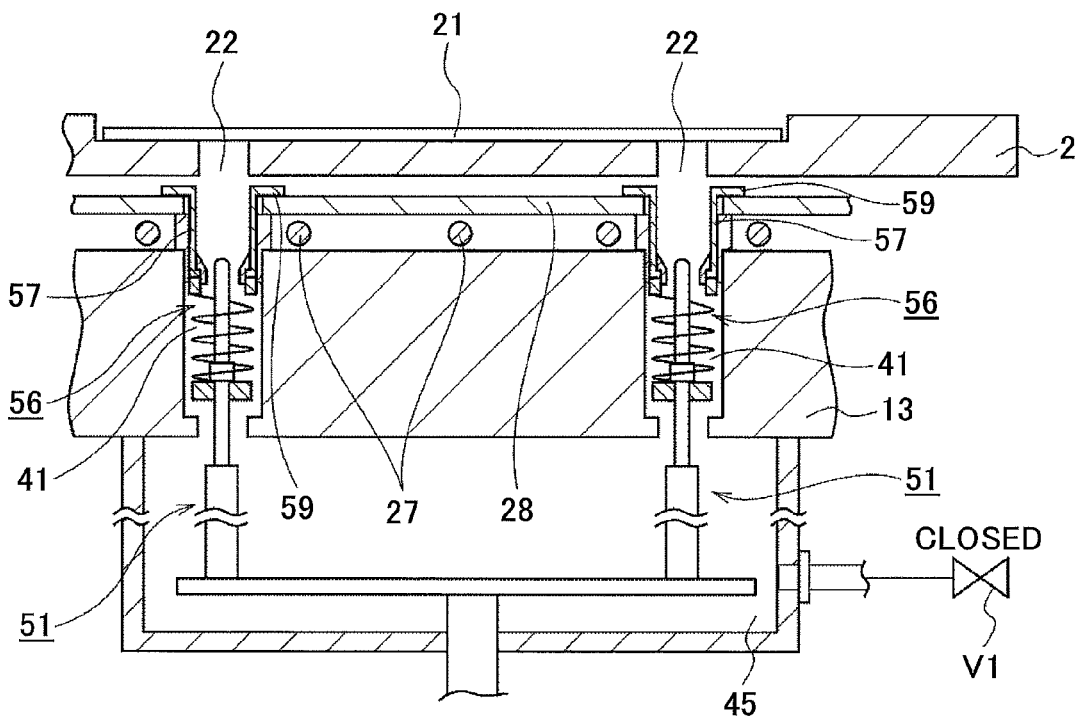
FIG. 14 is a fifth explanation drawing illustrating a state of the wafer being transferred into the vacuum chamber by the lifting pins.
Figure 15:
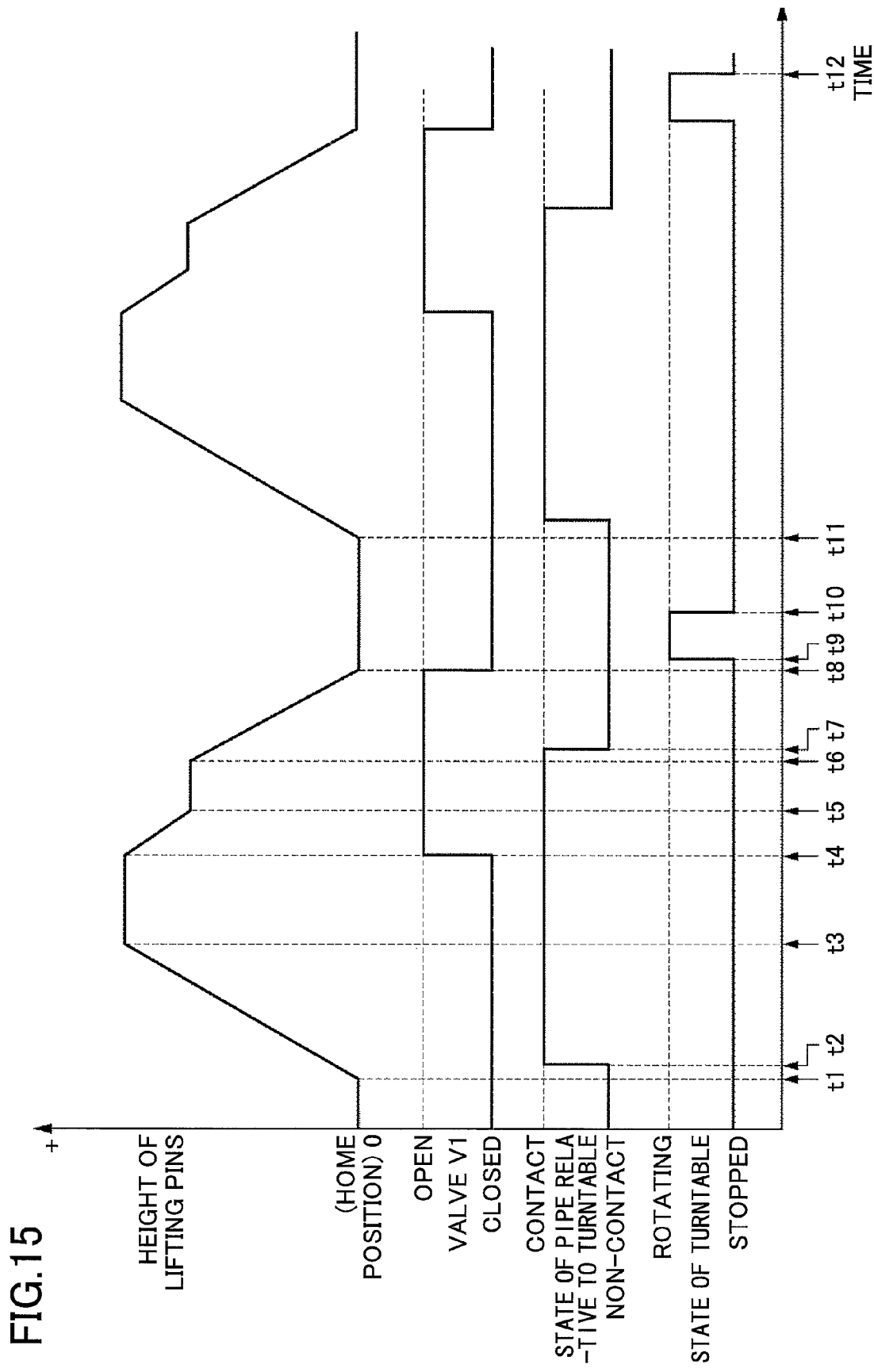

A description is given below of an operation in transferring the wafer W from the wafer transfer mechanism 18 to the turntable 2, with reference to FIGS. 9 through 14 illustrating operation of the lifting pins 51, the pipes 57 and the energizing mechanisms 56 and FIG. 15 illustrating a timing chart. The timing chart in FIG. 15 illustrates a height of the lifting pins 51, an open/close status of the valve V1 that evacuates the exhaust space 45 (see FIG. 1), whether the pipes 57 contact the turntable 2, and whether or not the turntable 2 is rotating. In the chart, the height of the lifting pins 51 is made zero when the lifting pins 51 are located at the home position, and indicates a higher position as a position on the graph is located at a greater position toward the plus side.

The turntable 2 is heated by the heater 27, and the turntable 2 is still in a state in which each of the through holes 22 of one of the five concave portions 21 overlaps with each of the opening 41 of the bottom part of the chamber body 13. Moreover, the lifting pins 51 wait at the home position and the valve V1 is closed. The inside of the vacuum chamber 11 is evacuated from the exhaust openings 37, and is made a vacuum atmosphere. Some amount of $N_2$ gas is supplied from the separation gas nozzles 32 and 34 to prevent the atmosphere in the vacuum chamber 11 from entering the separation gas nozzles 32 and 34. Some amount of $N_2$ gas is also supplied into the vacuum chamber from the central area C.

In such a state, the gate valve 17 is opened and the wafer transfer mechanism 18 holding the wafer W goes into the vacuum chamber 11 from the transfer opening 16. When the wafer transfer mechanism 18 transfers the wafer W on the openings 41 (see FIG. 9), as illustrated in FIG. 6, the lifting pins 51 move up (time t1 in the timing chart in FIG. 15). At this time, the inside of the vacuum chamber 11 is kept at a vacuum atmosphere. The vacuum atmosphere specifically means 240.0 Pa (1.8 Torr) or smaller.

Figure 10:
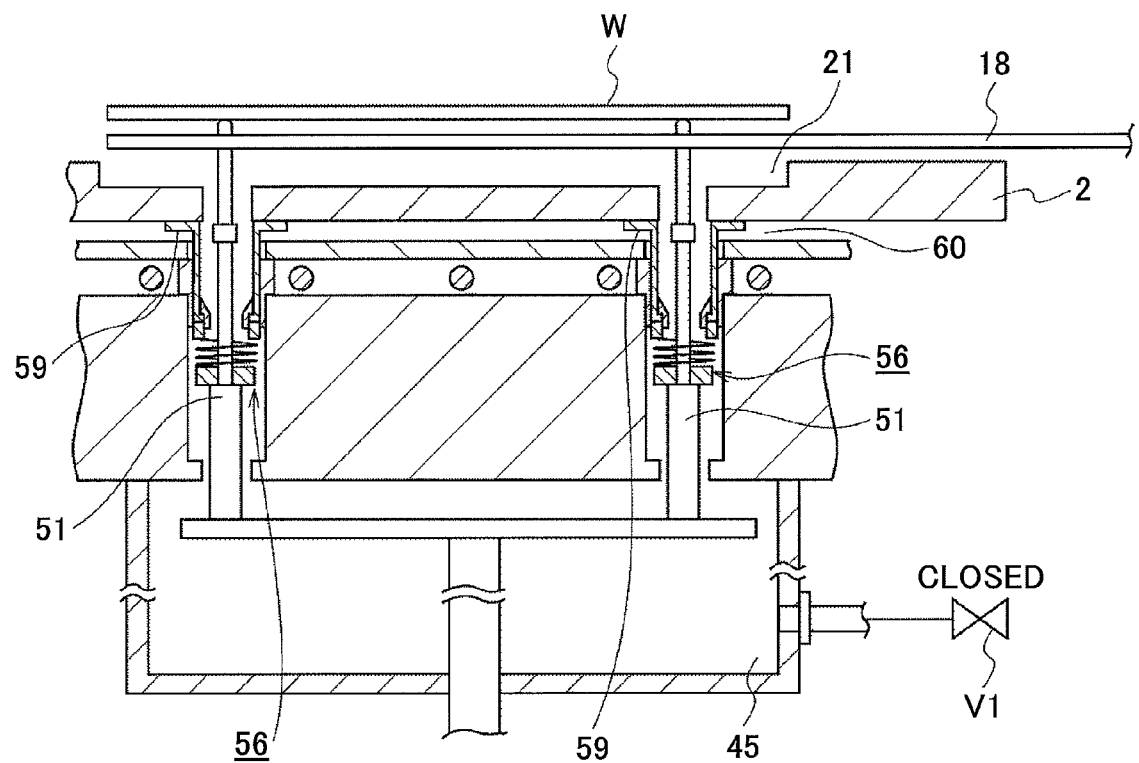
FIG. 10 is a first explanation drawing illustrating a state of a wafer being transferred into the vacuum chamber by the lifting pins.
Figure 11:
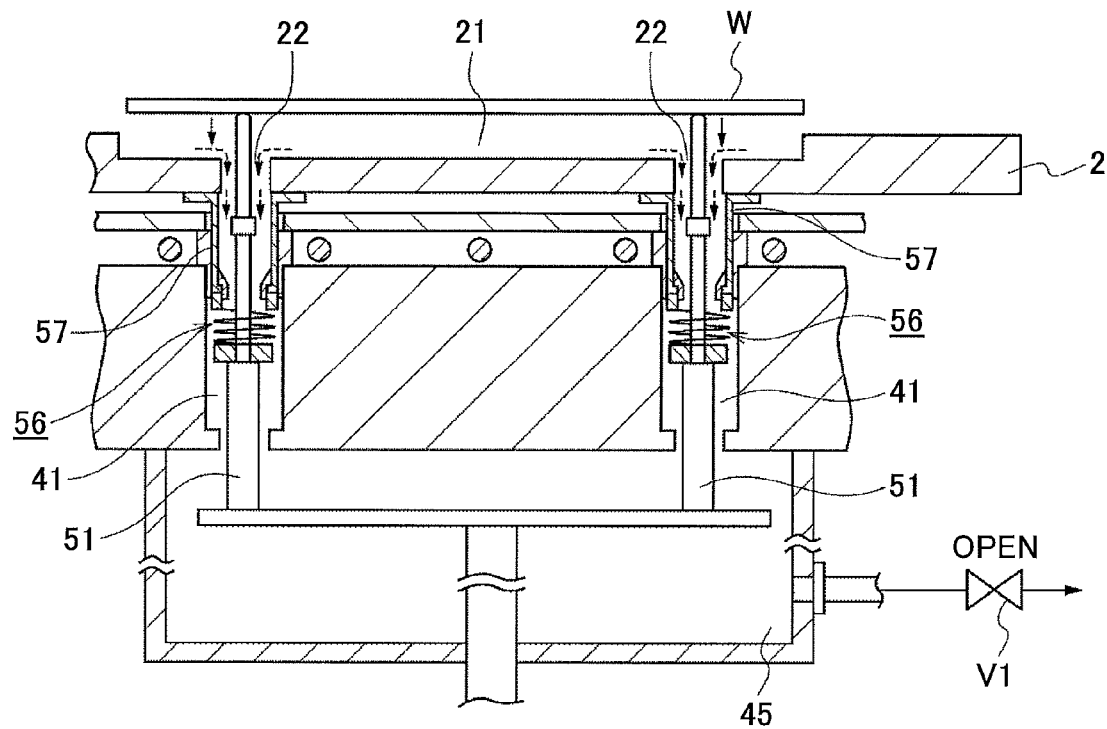
FIG. 11 is a second explanation drawing illustrating a state of the wafer being transferred into the vacuum chamber by the lifting pins.

The pipes 57 contact and adhere tightly to the back surface of the turntable 2 by the rise of the lifting pins 51 (time t2), and the lifting pins 51 push up the wafer W from the wafer transfer mechanism 18 and stop (see FIG. 10, time t3). When the wafer transfer mechanism 18 goes out of the vacuum chamber 11 to receive a wafer W (a second wafer W) to be transferred into the vacuum chamber 18 subsequently, the lift pins 51 begin to move down while the valve V1 is opened and the pressure inside the exhaust space 45 is reduced to, for example, 80.0 Pa (0.6 Torr) (see FIG. 11, time t4). FIG. 7 described above illustrates the lifting pin 51 at time t4, and FIGS. 7 and 11 illustrate exhaust flows by directional dashed lines. As discussed above, because the separated flow passages connecting the through holes 22 with the exhaust space 45 are formed by the pipes 57, the inside of the concave portions 21 is selectively evacuated.

Figure 12:
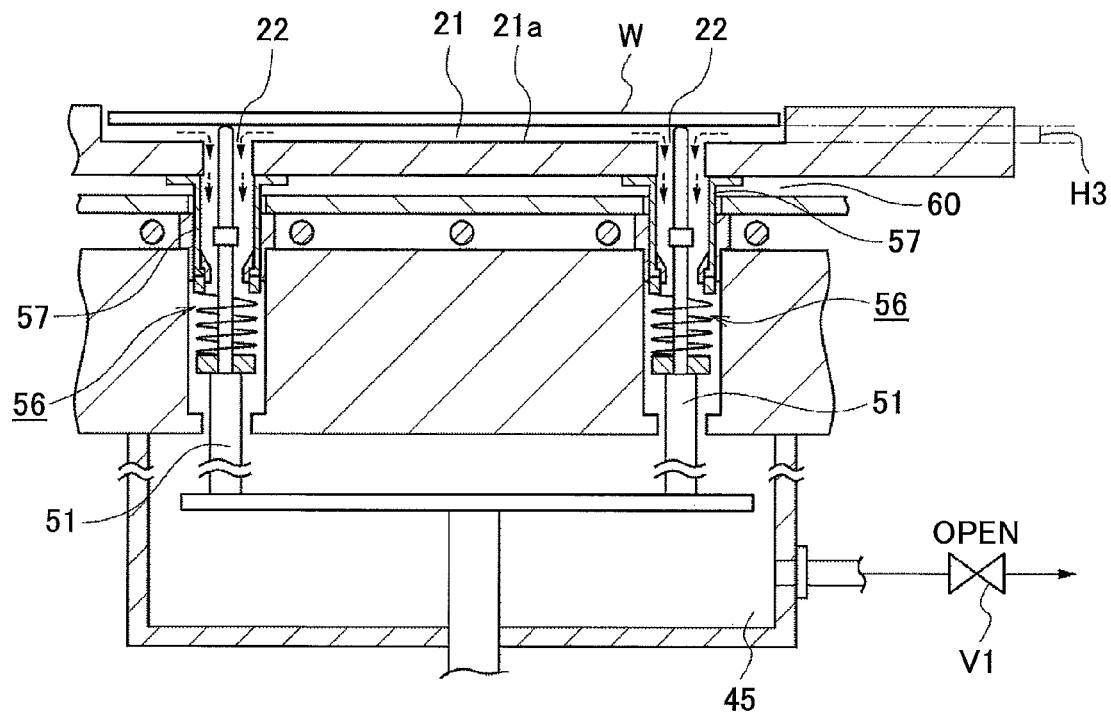
FIG. 12 is a third explanation drawing illustrating a state of the wafer being transferred into the vacuum chamber by the lifting pins.
Figure 13:
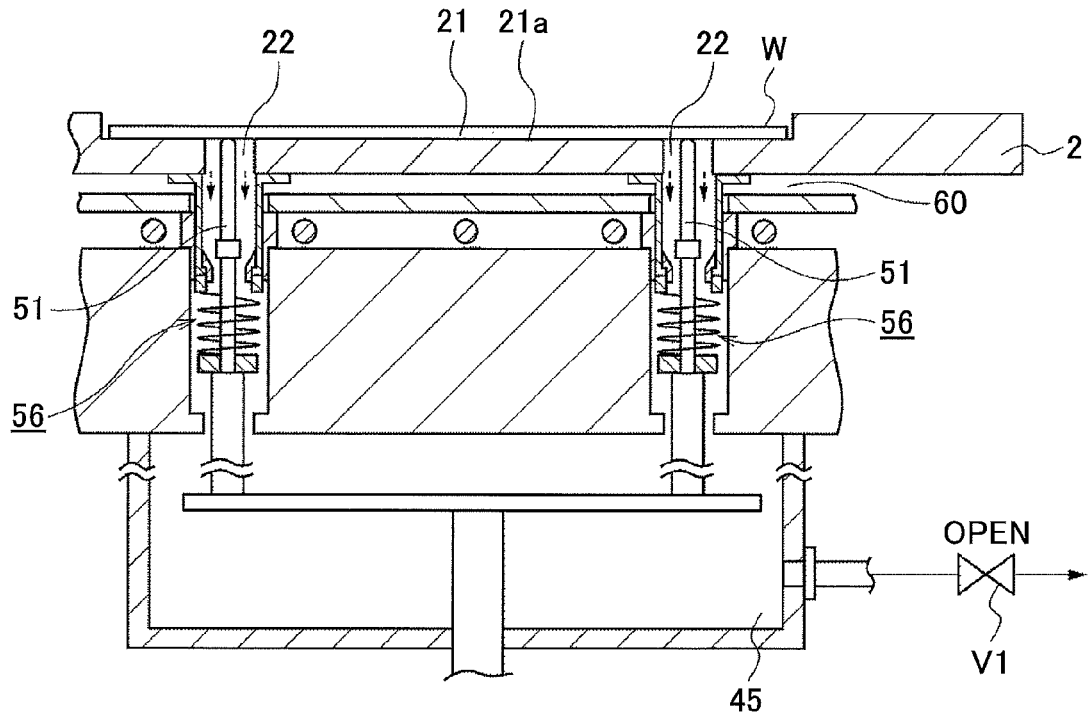
FIG. 13 is a fourth explanation drawing illustrating a state of the wafer being transferred into the vacuum chamber by the lifting pins.

When the evacuation of the concave portions 21 and the fall of the lifting pins 51 are continued and the wafer W approaches the bottom surface 21a of the concave portion 21, the fall of the lifting pins 51 is stopped once, and the lifting pins 51 stand still (see FIG. 12, time t5). In this stationary state, a distance H3 between the bottom surface 21a of the concave portion 21 and the lower surface of the wafer W illustrated in FIG. 12 is, for example, 0.6 mm, and the surface (upper surface) of the wafer W is lower than the upper end of the side wall of the concave portion 21. In other words, the concave portion 21 is evacuated from the through holes 22 in a state of being closed (covered) by the wafer W. This prevents an upper area of the concave portion 21 from being evacuated, and the gas inside the concave portion 21 is certainly removed. Then, the pressure on the lower surface side of the wafer W is reduced to 0.6 Torr as well as the exhaust space 45.

After that, the lifting pins 51 move down again (time t6). As described above, the lower side of the wafer W is reduced to 0.6 Torr, which is lower than 1.8 Torr that is a pressure on the upper side of the wafer W. In this manner, the wafer W receives a force heading from the upper surface side to the lower surface side by the pressure difference formed between the upper side and the lower side of the wafer W while being supported by the lifting pins 51 and moving down, and is placed on the bottom surface 21a of the concave portion 21 in close contact with the bottom surface 21a without floating up. The placed wafer W is heated by heat transfer from the turntable 2 (see FIG. 13). A time period from time t5 to time t6 is, for example, made five seconds.

Figure 8:
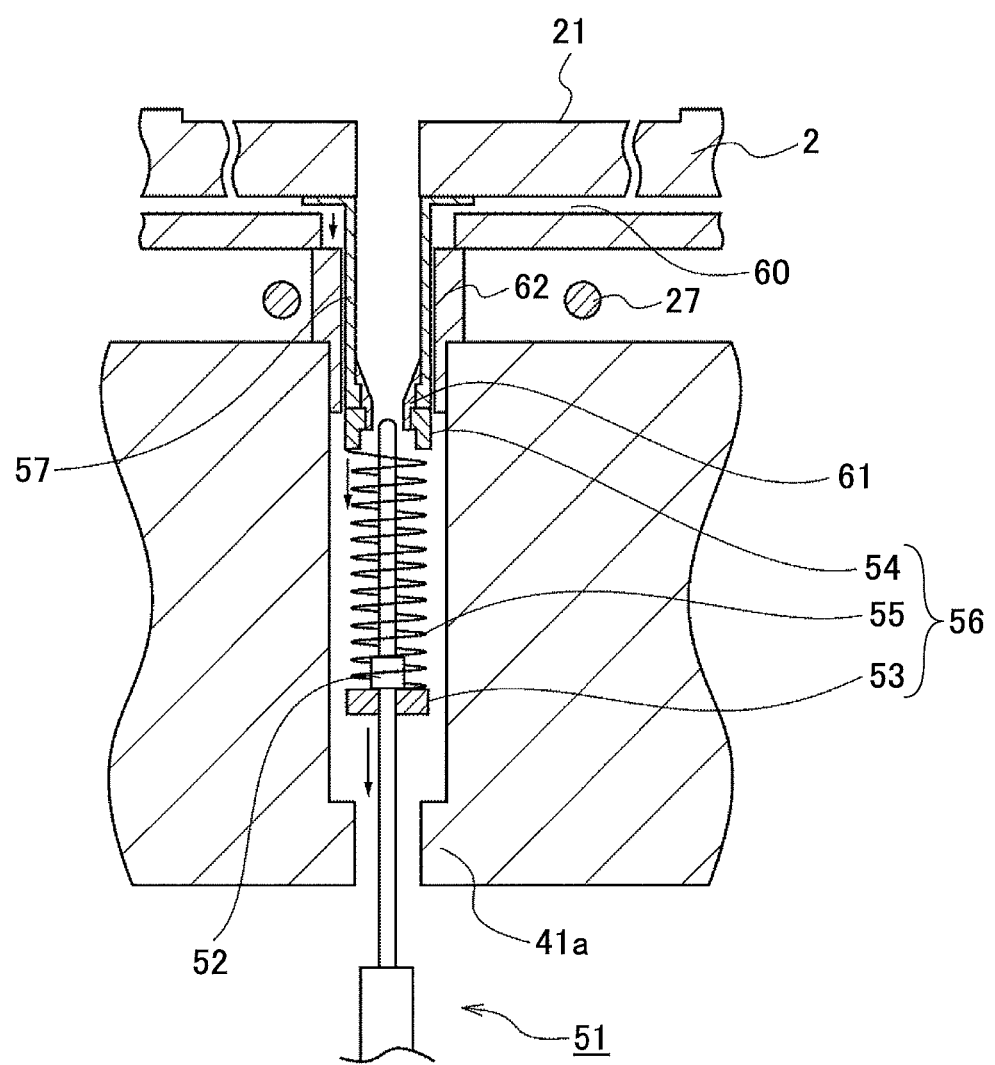
FIG. 8 is a third explanation drawing illustrating the operation of the lifting pin.
Figure 9:
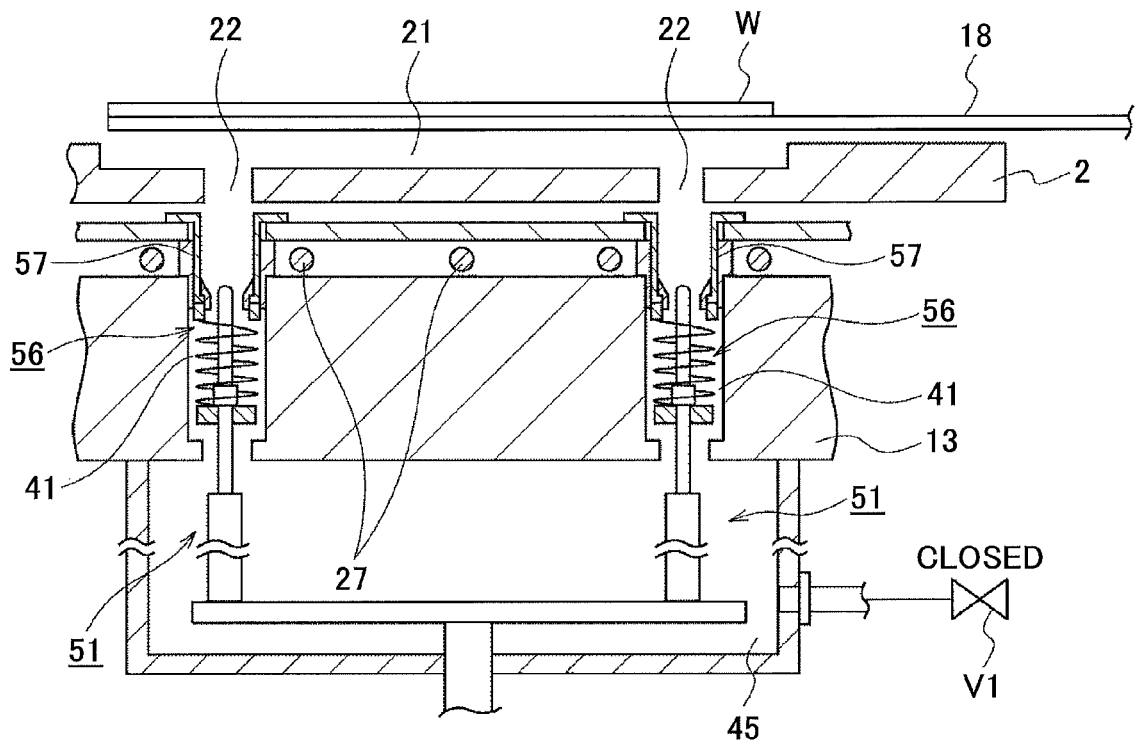
FIG. 9 is a fourth explanation drawing illustrating the operation of the lifting pin.

When the lifting pins 51 continued to be lowered to cause the pipe 57 to separate from the turntable 2 as described in FIGS. 4 and 8 (time t7) and the lifting pins 51 return to the home position, the valve V1 is closed and the evacuation of the exhaust space 45 is stopped (see FIG. 14, time t8). After that, the turntable 2 is rotated in a clockwise fashion when seen in a plan view (time t9), and when each of the through holes 22 of the concave portion 21 adjacent to one on which the wafer W (the first wafer W) is placed overlaps with each of the openings 41, the turntable 2 stops rotating (time t10). After the rotation stops, the second wafer W is transferred into the vacuum chamber 11 by the wafer transfer mechanism 18. The second wafer W is transferred to the concave portion 21 located above the openings 41 as well as the first wafer W. In FIG. 15, during time period t1 through t12, the operation described in time period t1 through t10 is performed again.

Thus, the wafers W are sequentially transferred to the concave portions 21 by performing the rise and fall of the lifting pins 51, the evacuation while lowering the lifting pins 51 to the home position, and the intermittent rotation of the turntable 2. Then, after the wafers W are placed on all of the five concave portions 21, the gate valve 17 is closed. The inside of the vacuum chamber 11 is controlled to become a vacuum atmosphere having a predetermined pressure, and the turntable 2 rotates in the clockwise fashion when seen in a plan view. An amount of $N_2$ gas supplied from the separation gas nozzles 32 and 34 and the central area C is increased. Reaction gases are supplied from the first reaction gas nozzle 31 and the second reaction gas nozzle 33.

The wafers W pass through the first process area P1 under the first reaction gas nozzle 31 and the second process area under the second reaction gas nozzle 33 alternately. BTBAS gas adsorbs on the wafers W, and then $O_3$ gas adsorbs on the wafers W, by which BTBAS molecules are oxidized and one or more molecular layers of silicon oxide are deposited on the wafers W. In this manner, the molecular layers of silicon oxide film are sequentially deposited in a layer-by-layer manner and a silicon oxide film having a predetermined thickness is deposited.

Figure 16:
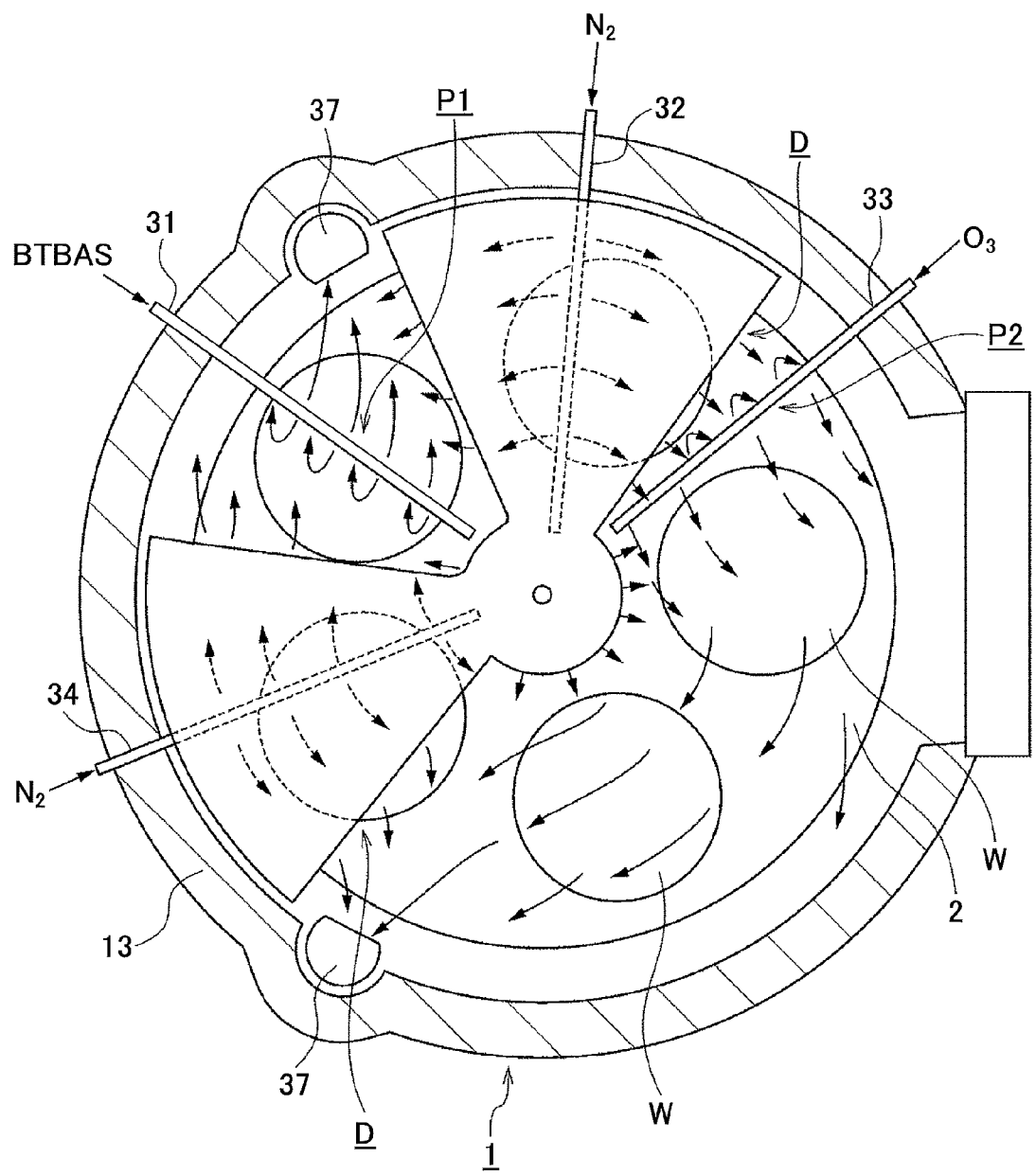
FIG. 16 is an explanation drawing illustrating an air current formed inside the vacuum chamber.

FIG. 16 illustrates flows of the gases inside the vacuum chamber 11 by arrows. $N_2$ gas supplied from the separation gas nozzles 32 and 34 to the separation areas D expands in the separation areas D in a circumferential direction, and prevents BTBAS gas and $O_3$ gas from mixing with each other above the turntable 2. Moreover, $N_2$ gas supplied to the central area C expands outward in a radius direction of the turntable 2, and prevents BTBAS gas and $O_3$ gas from mixing with each other in the central area C. Furthermore, in the film deposition apparatus 1, $N_2$ gas is supplied to the heater accommodation space 29 and the back surface side of the turntable 2 from the gas supply pipes 19 and 26 (see FIG. 1), thereby purging the reaction gases.

As described above, because the lower surfaces of the wafers W are in close contact with the bottom surfaces 21a of the concave portions 21, strong frictional forces act on the wafers W, and the wafers W remain in the concave portions 21 despite a centrifugal force caused by the rotation of the turntable 2. In addition, because the wafers W are accommodated in the concave portions 21 in close contact with the bottom surfaces 21a in such a manner, the wafers W are unlikely to receive a pressure from each of the gases flowing in a lateral direction and remain in the concave portions 21 despite the gas flows. Thus, the turntable 2 continues to rotate and the film deposition process goes on in a state in which the wafers W are stably accommodated in the concave portions 21.

When a silicon oxide film having a predetermined film thickness is deposited by a predetermined number of times of the rotation of the turntable 2, the supply of the reaction gases from the reaction gas nozzles 31 and 32 stops, and the supply amount of $N_2$ gas to the separation gas nozzles 32 and 34 and the central area C decreases. The rotation of the turntable 2 stops, and the gate valve 17 is opened. The lifting pins 51 move up from the home position, and push up the wafer W accommodated in one of the concave portions 21. When the wafer transfer mechanism 18 goes into the vacuum chamber 11 so as to be positioned under the back surface of the wafer W that is pushed up, the lifting pins 51 move down to the home position so that the wafer W is transferred to the wafer transfer mechanism 18, and the wafer W is transferred from the vacuum chamber 11.

Thus, when the wafer W is transferred to the wafer transfer mechanism 18, the exhaust space 45 is not evacuated while the lifting pins 51 are moving down to the standby area unlike in the case of transferring the wafer W from the wafer transfer mechanism 18 to the turntable 2. Moreover, the lifting pins 51 do not stand still on the way to the home position. The wafers W on the other concave portions 21 are sequentially transferred to the wafer transfer mechanism 18 and carried out of the vacuum chamber 11 by the intermittent rotation of the turntable 2 and the rise and fall of the lifting pins 51.

According to the film deposition apparatus 1 in the embodiment, after a wafer W is transferred to the elevated lifting pins 51 from the wafer transfer mechanism 18 and before the lifting pins 51 move down and the wafer W is placed on the concave portion 21, the concave portion 21 is selectively evacuated from through holes 22 opened in the concave portion 21 of a turntable 2. Accordingly, even if $N_2$ gas remains in the concave portion 21 when the wafer W is transferred to the lifting pins 51, because the gas is removed when the wafer is placed on the concave portion 21, the wafer W can be prevented from floating up from the bottom surface 21a of the concave portion 21 and from moving so as to slide laterally. This can prevent a periphery of the wafer W from being placed on an outer edge of the concave portion 21 so as to run up against the edge of the concave portion 21. Hence, the wafer W can be prevented from being out of the concave portion 21 by an air current and a centrifugal force caused by the rotation of the turntable 2. As a result, failure of normal film deposition on the wafer W can be prevented. Moreover, preventing the wafer W from floating up from the bottom surface 21a of the concave portion 21 and from moving caused thereby, serve to prevent friction between components in the vacuum chamber and the wafer W. This makes it possible to reduce the generation of particles. In this manner, by reducing the ejection of the wafer W and the generation of the particles, a decrease in the yield rate of semiconductor products manufactured from the wafer W can be prevented.

Furthermore, in the film deposition apparatus 1 according to the embodiment, the evacuation is performed when the lifting pins 51 move down so that the surface of the wafer W is positioned lower than the upper end of the side wall of the concave portion 21. That is to say, because the concave portion 21 is evacuated when the concave portion 21 is closed (covered) by the wafer W, the gas in the concave portion 21 is certainly removed. By evacuating the concave portion 21 when a lower surface of the wafer W is as high as an upper end of the concave portion 21 or lower than the upper end of the concave portion 21, because the concave portion is closed by the wafer W and a gap formed between the bottom surface 21a of the concave portion 21 and the lower surface of the wafer W is separated from an area above the concave portion 21, the gas in the concave portion 21 can be removed. In addition, in the film deposition apparatus 1 of the embodiment, as discussed above, when the concave portion 21 is closed by the wafer W, because the fall of the lifting pins 51 is stopped once and the concave portion 21 is evacuated in a state in which the wafer W is still, the gas inside the concave portion 21 can be certainly removed.

In the above example, the concave portion 21 is evacuated at each height from when the wafer W is supported by the lifting pins 51 and to when the wafer W is placed on the concave portion 21, but the evacuation may be performed only when the wafer W is close to the bottom surface 21a of the concave portion 21. More specifically, the evacuation may be performed only when a distance between the lower surface of the wafer W and the bottom surface 21a of the concave portion 21 is greater than 0 mm and equal to 20 mm or less, or more preferably greater than 0 mm and equal to 2.0 mm or less. In this way, in the event that the evacuation is performed only when the wafer W is close to the bottom surface 21a of the concave portion 21, continuing the evacuation is not limited to when the wafer W is located at a position where the distance between the bottom surface 21a of the concave portion 21 and the lower surface of the wafer W is equal to or less than 20 mm, but the evacuation may be performed when the wafer W is located at a predetermined height in the above range.

Moreover, in the film deposition apparatus 1 of the embodiment, by controlling a differential pressure between the pressure inside the vacuum chamber 11 and the pressure of the exhaust space 45 so as to become 160.0 Pa (1.8 Torr−0.6 Torr=1.2 Torr), a pressure difference is formed between an upper surface side and a lower surface side of the wafer W to cause a force heading downward to act on the wafer W, and the wafer W can be certainly placed in the concave portion 21. To obtain such an effect, setting the differential pressure at 1 Pa or greater is considered to be effective.

Furthermore, the through holes 22 of the turntable 2 to move the lifting pins 51 up and down and the openings 41 of the chamber body 13 are used as suction paths to evacuate the concave portion 21. Accordingly, because desiccated suction paths for the above evacuation do not have to be formed in the turntable 2 and the chamber body 13, an increase in manufacturing cost of the film deposition apparatus 1 can be prevented. However, the dedicated openings may be provided in the concave portions 21 other than the through holes 22. The dedicated openings are not limited to be provided in the bottom surfaces 21a of the concave portions, but may be provided in a side wall of the concave portion 21.

In addition, in the film deposition apparatus 1 according to the embodiment, the pipes 57 switchable between a state in close contact with the turntable 2 and a state separated from the turntable 2 depending on a height position of the lifting pins 51 are provided. This enables the concave portion 21 to be selectively evacuated without preventing the rotation of the turntable 2 when the wafer W is transferred and a film deposition process is performed. Moreover, the close contact of the pipes 57 with the turntable 2 is implemented by the energizing forces of springs 55 of energizing mechanisms 56 that are moved up and down by the lifting pins 51. Because of this, a dedicated elevating mechanism for moving the pipes 57 up and down so as to make the pipes 57 in close contact with the turntable 2 does not have to be provided. Accordingly, complication of a configuration of the film deposition apparatus 1 and an increase in manufacturing cost of the film deposition apparatus 1 can be both prevented.

The embodiment of the present invention can be applied to a variety of apparatuses that perform a gas process in a vacuum atmosphere, and the application thereof is not limited to film deposition apparatuses. For example, the embodiment can be applied to an etching apparatus that supplies an etching gas to a wafer W in a vacuum atmosphere and forms plasma in a vacuum chamber, thereby performing dry etching in the wafer W. Moreover, although the plurality of concave portions are configured to be rotated relative to the rotational center of the turntable 2 by the rotation of the turntable 2 in the above example, only a single concave portion may be provided in the turntable 2. Furthermore, the receiving areas of the wafers W are not limited to a configuration constituted of the concave portions 21. For example, providing a plurality of projections along a circle at intervals on the turntable 2 is possible. The projections are regulation parts to regulate positions of the wafers W in the turntable 2, and the wafers W are placed on areas surrounded by the projections. The receiving areas formed in such a manner may be configured to be selectively evacuated as discussed above.

Second Embodiment

Figure 17:
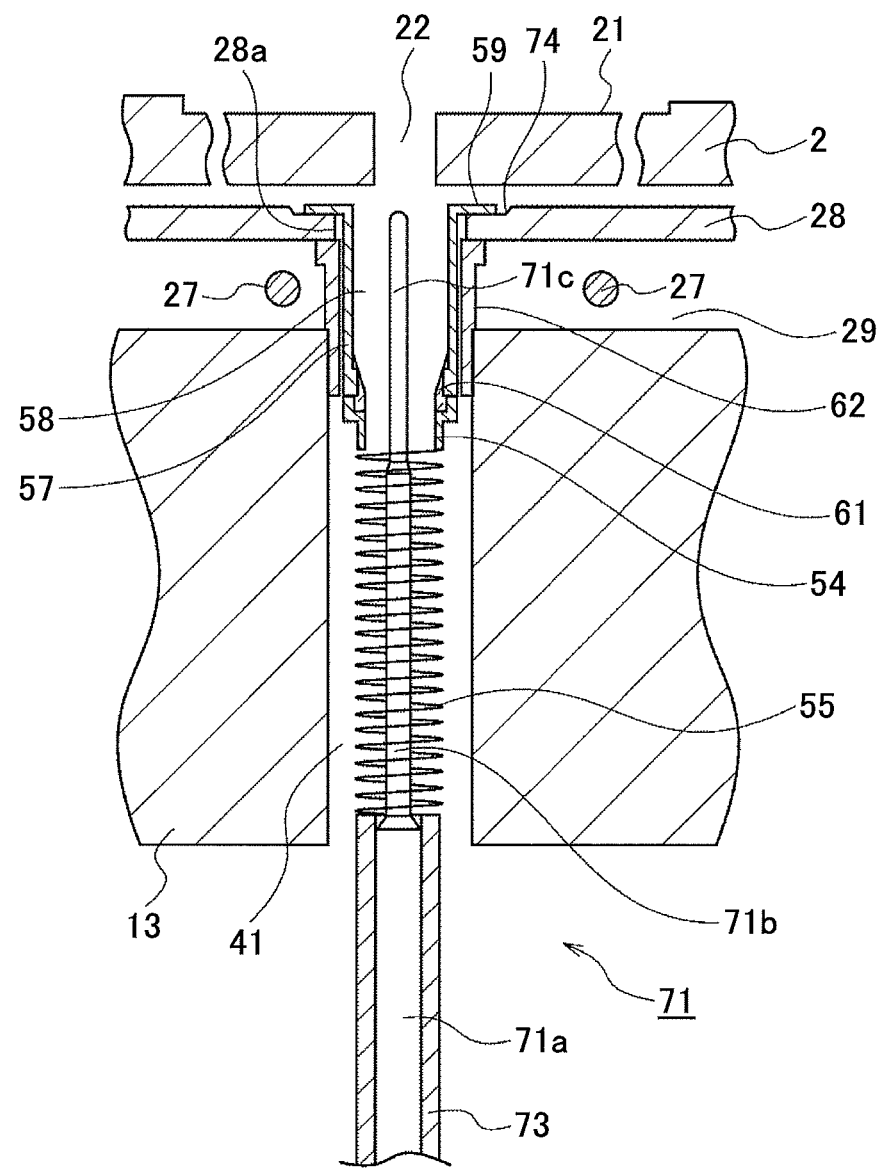
FIG. 17 is an explanation drawing illustrating another configuration of the lifting pin and an energizing mechanism.

A description is given below of lifting pins and energizing mechanisms used in a vacuum processing apparatus according to a second embodiment of the present invention, with a focus on different points with reference to FIG. 17. The same numeral as the first embodiment is attached to a component configured similarly to the first embodiment, and a description thereof is omitted. FIG. 17 illustrates a state of a lifting pin 71 of the second embodiment located at a home position. The lifting pin 71 does not include the flange 52 but includes an intermediate part 71b having a smaller diameter than that of a base part 51a and provided on the base part 71a that constitutes a part of the lifting pin 71, and a tip part 71c having a smaller diameter than that of the intermediate part 71b and provided on the intermediate part 71b.

An energizing mechanism 72 according to the second embodiment includes a sleeve 73 instead of the lower ring member 53. This sleeve 73 is provided so as to surround the base part 71a and moves up and down together with the base part 71a. A coiled spring 55 is provided to connect a lower end of an upper ring member 54 with an upper end of the sleeve 73. As illustrated in FIG. 17, a concave part 74 for aligning a flange 59 of the pipe 57 is provided in an upper surface of a plate 28.

Figure 18:
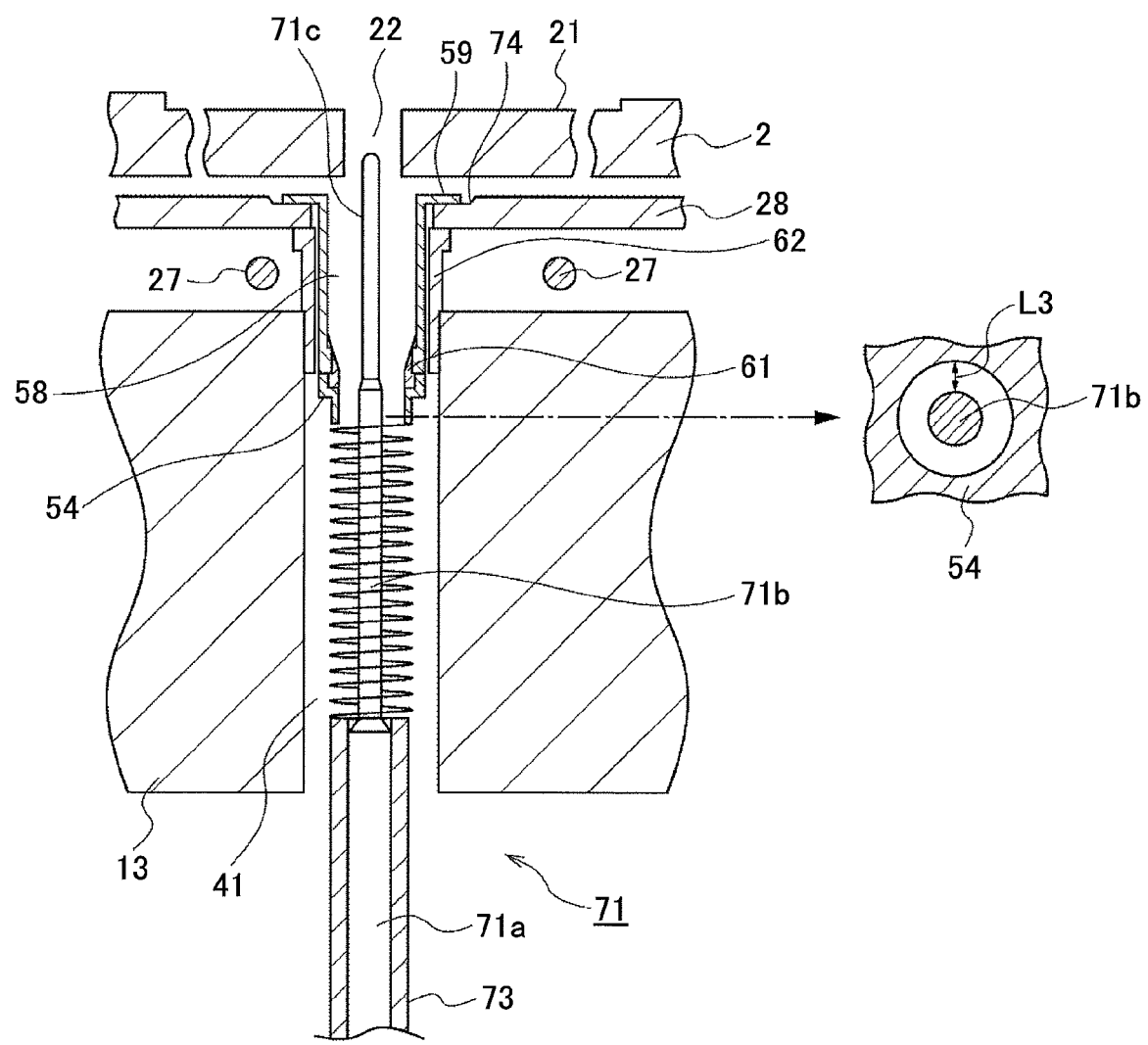
FIG. 18 is a fifth explanation drawing illustrating the operation of the lifting pin.

FIG. 18 illustrates a state in which the lifting pin 71 moves up from a home position and the intermediate part 71b goes into the upper ring member 54. In FIG. 18, as well as FIG. 6, a horizontal cross section plan view of the upper ring member 54 and the lifting pin 71 at this time is indicated by an arrow with a chain line. A distance L3 between an inner circumference of the upper ring member 54 and an outer circumference of the intermediate part 71b illustrated in FIG. 18 is set at 3.5 mm in this example. More specifically, because a clearance between the lifting pin 71 and the upper ring member 54 is greater than that in the first embodiment, a conductance of the evacuation is higher than that in the first embodiment, and a gas in the concave portion 21 can be more certainly removed.

Figure 19:
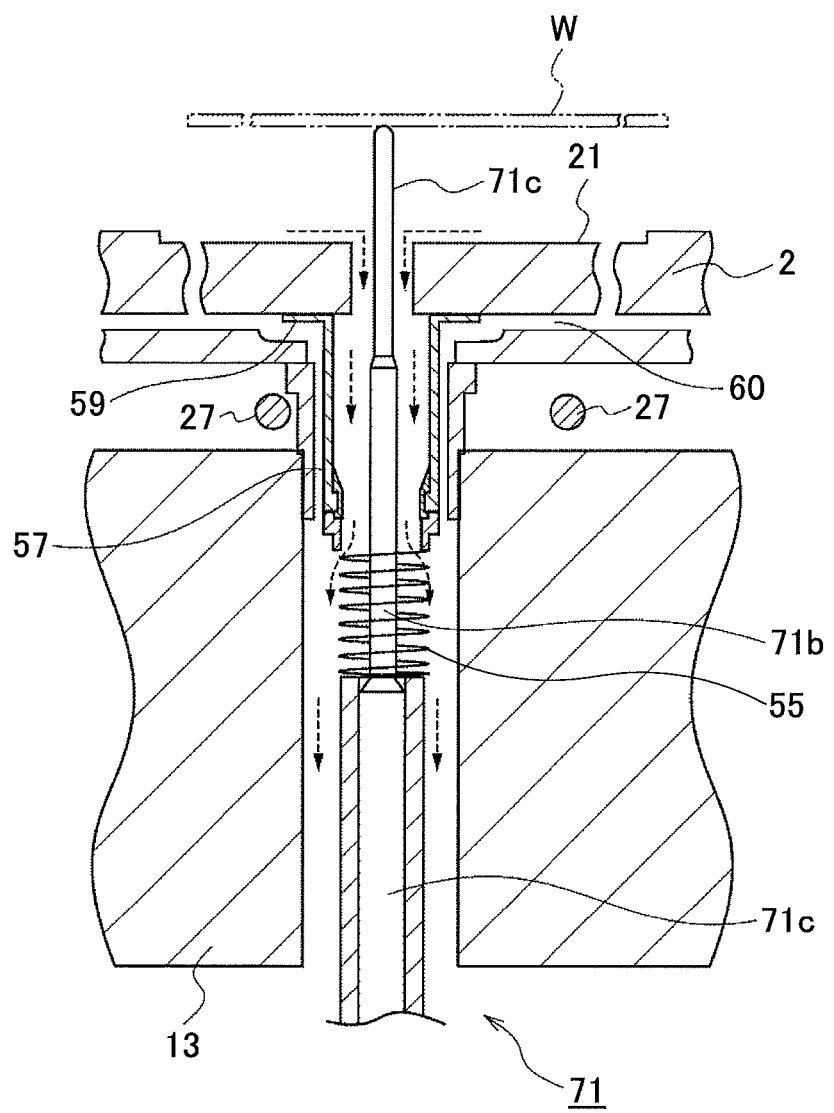
FIG. 19 is a sixth explanation drawing illustrating the operation of the lifting pin.

FIG. 19 illustrates a state of the lifting pin 71 further moving up from the position illustrated in FIG. 18. The state of FIG. 19 means a state of the lifting pin 71 located at a position for receiving the wafer W, as described in FIG. 10. In the middle of the rise of the lifting pin 71 in this manner, the pipe 57 is energized and in close contact with a back surface of the turntable 2 by a coiled spring 55. Similar to the first embodiment, the concave portion 21 is evacuated when the lifting pin 71 moves down from the position illustrated in FIG. 19. In FIG. 19, as well as FIG. 7, formed exhaust currents are indicated by dashed directional lines.

When the lifting pin 71 moves down from the state illustrated in FIG. 19, an energizing force of the pipe 57 to the turntable 2 weakens, and the energy is released when the lifting pin 71 reaches a predetermined height. When the lifting pin 71 further moves down, the pipe 57 is pulled down by a tensile force of a coiled spring 55. Then, as illustrated in FIG. 17, a flange 59 of the pipe 57 fits into the concave part 74, and the lifting pin 71 is located at the home position.

[Evaluation Test]
Evaluation Test 1

A wafer W was transferred from the wafer transfer mechanism 18 to the lifting pins 51 of the above film deposition apparatus 1, and the lifting pins 51 were lowered to place the wafer W on the concave portion 21. After the placement, an amount of deviation of the wafer W from an area on which the wafer W should be placed according to design (migration length) was measured. The transfer of the wafer W to the concave portion 21 and the measurement of the migration length of the wafer W were repeated. However, in the evaluation test 1, unlike in the case of the transfer described in the above embodiments, the evacuation of the concave portion 21 had not been performed since the wafer W was moved down to the concave portion 21 and until the wafer W was placed on the concave portion 21.

Figure 20:
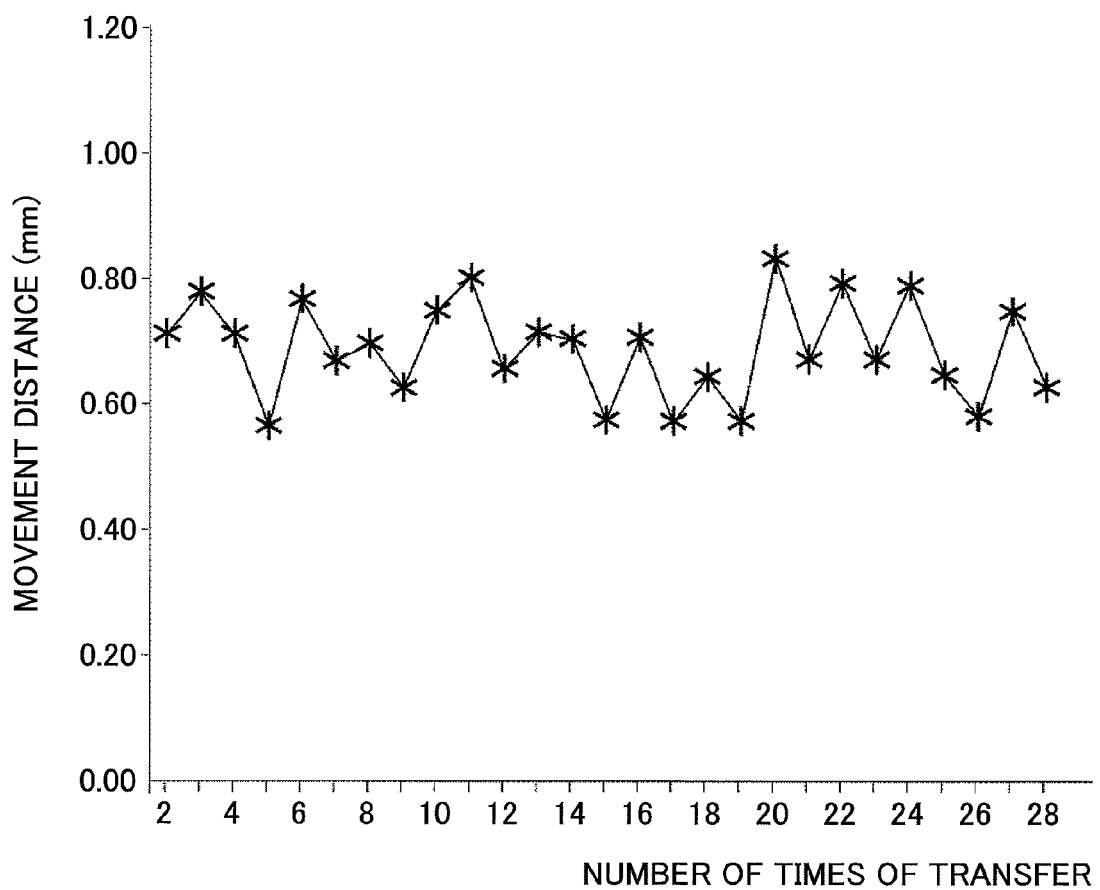
FIG. 20 is a graph showing a result of an evaluation test.

In FIG. 20, a graph shows a test result of a wafer W on which a SiN film 300 μm thick was deposited. The vertical axis in the graph indicates the migration length (unit: mm), and the horizontal axis indicates a number of times of the transfer. In the graph, a subset of the points is plotted for simplicity. As shown in the graph, the migration of the wafer W occurred in a range from 0.55 to 0.85 mm.

Evaluation Test 2

Similar to the evaluation test 1, the transfer of the wafer W to the concave portion 21 and the measurement of the migration length of the wafer W were performed. In the evaluation test 2, as described in the first embodiment, the evacuation of the concave portion was performed from the through holes 22 when the wafer W was transferred to the concave portion 21. In the evaluation test 2, the transfer of the wafer W and the measurement of the migration length of the wafer W were performed a greater number of times than the evaluation test 1.

In FIG. 21, as well as FIG. 20, a graph shows a test result of a wafer W on which a SiN film 400 μm thick was deposited. The horizontal axis and the vertical axis in the graph indicate a number of times of the transfer of the wafer W and the migration length of the wafer W, respectively. In the graphs, as well as the evaluation test 1, a subset of the points is plotted for simplicity.

As shown in the graph, the migration lengths fell within a range equal to or less than 0.3 mm for each number of times of the transfer, and decreased more widely than the result of the evaluation test 1. Considering that the film thicknesses of the SiN film deposited on each of the wafers W were almost the same, from the results of the evaluation tests 1 and 2, it can be said that the migration length of the wafer W was reduced by evacuating the concave portion 21. Moreover, from the results of the evaluation tests 1 and 2, as described in the "Background of the Invention" section of the present specification, it is inferred that a gas remains immediately above the surface of the turntable 2 even if a vacuum atmosphere is formed in the vacuum chamber 11 when transferring the wafer W.

According to the embodiments of the present invention, an exhaust mechanism is provided to selectively evacuate a receiving area before placing a substrate on the receiving area provided in a turntable by using a lifting member to support the substrate in a vacuum chamber having a vacuum atmosphere. Hence, the substrate can be prevented from floating up from the receiving area by the remaining gas. As a result, the substrate can be prevented from moving out of the substrate receiving area due to a centrifugal force caused by the rotation of the turntable and due to an air current in the vacuum chamber. Accordingly, performing an abnormal process on the substrate can be prevented, and a decrease in the yield rate of products manufactured from the substrate can be reduced.

All examples recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority or inferiority of the invention.

What is claimed is:

1. A vacuum processing apparatus comprising:
a process chamber, inside of which a vacuum atmosphere is formed upon evacuation of the process chamber;
a turntable provided in the process chamber;
a substrate receiving area provided in one surface of the turntable and including a regulation part formed therearound to regulate a position of a substrate;
a gas supply part to supply a process gas to the substrate on the turntable;
a transfer mechanism provided outside the process chamber and configured to transfer the substrate into the process chamber;
a lifting member configured to support the substrate and to move up and down in order to transfer the substrate between the transfer mechanism and the turntable; and
an exhaust mechanism configured to selectively evacuate a gap between the substrate receiving area and the substrate before the lifting member places the substrate on the substrate receiving area.

2. The vacuum processing apparatus as claimed in claim 1, wherein the substrate receiving area is a concave portion formed in the turntable, and the regulation part is a side wall of the concave portion.

3. The vacuum processing apparatus as claimed in claim 2, wherein the exhaust mechanism is configured to evacuate the concave portion in a first state in which a lower surface of the substrate is located at a position as high as an upper end of the side wall of the concave portion or lower than the upper end of the side wall of the concave portion.

4. The vacuum processing apparatus as claimed in claim 3, wherein the lifting member stops moving up and down in the first state.

5. The vacuum processing apparatus as claimed in claim 2, wherein the exhaust mechanism is configured to evacuate the concave portion when a distance between a lower surface of the substrate and a bottom surface of the concave portion is greater than 0 mm and equal to or smaller than 20 mm.

6. The vacuum processing apparatus as claimed in claim 1, wherein the exhaust mechanism includes a separating member configured to form an exhaust space to be evacuated on the other surface of the turntable, the separating member being separated from the one surface of the turntable, and
the turntable includes a gas suction path having one end opened in the one side of the turntable and the other end capable of being communicated with the exhaust space to be able to evacuate the gap by evacuating the exhaust space.

7. The vacuum processing apparatus as claimed in claim 6, wherein the exhaust space is formed apart from the turntable, and
the exhaust mechanism includes a flow passage forming member configured to form a gas flow passage having one end in communication with the exhaust space, and the apparatus further comprising:
a moving mechanism configured to move the flow passage forming member in order to switch a first state in which the other end of the flow passage is connected to the gas suction path and a second state in which the other end of the flow passage is disconnected from the gas suction path.

8. The vacuum processing apparatus as claimed in claim 7, wherein the moving mechanism is configured to operate with a rise and a fall of the lifting member.

9. The vacuum processing apparatus as claimed in claim 8, wherein the moving mechanism is constituted of an energizing mechanism to switch a first state of energizing the flow passage forming member depending on a height of the lifting member and a second state of releasing the energization of the flow passage forming member in the first state.

10. The vacuum processing apparatus as claimed in claim 9,
wherein the lifting member includes a first engagement part, and
the energizing mechanism includes a second engagement part configured to engage with the first engagement part by the fall of the lifting member so as to separate the flow passage forming member from the other surface of the turntable.

11. The vacuum processing apparatus as claimed in claim 6,
wherein the lifting member is configured to move down so as to place the substrate on a bottom surface of a concave portion while the exhaust mechanism evacuates the exhaust space so as to have a first pressure lower than a second pressure in a space on the one side of the turntable by 1 Pa or more.

12. The vacuum processing apparatus as claimed in claim 6, wherein the gas suction path is configured to also serve as a migration path of the lifting member.

13. A vacuum processing method, the method comprising steps of:
evacuating a process chamber to form a vacuum atmosphere inside the process chamber;
rotating a substrate receiving area including a regulation part formed therearound to regulate a position of a substrate provided in one surface of a turntable provided in the process chamber by rotating the turntable;
moving a lifting member supporting the substrate up and down to transfer the substrate between a substrate transfer mechanism and the turntable;
supplying a process gas from a gas supply part to the substrate on the turntable; and
selectively evacuating a gap between the substrate receiving area and the substrate by an exhaust mechanism before the lifting member places the substrate on the substrate receiving area.

14. The method as claimed in claim 13,
wherein the substrate receiving area is a concave portion formed in the one surface of the turntable and the regulation part is a side wall of the concave portion, and
wherein the step of selectively evacuating the gap between the substrate receiving area and the substrate includes a step of selectively evacuating the gap between the concave portion and the substrate.

15. The method as claimed in claim 14, wherein the step of selectively evacuating the gap between the concave portion and the substrate includes a step of selectively evacuating the concave portion in a first state in which a lower surface of the substrate is located at a position as high as an upper end of the side wall of the concave portion or lower than the upper end of the side wall of the concave portion.

16. The method as claimed in claim 15, wherein the lifting member stops moving up and down in the first state, and the concave portion is evacuated when the lifting member stops moving up and down.

17. The method as claimed in claim 14, wherein the step of selectively evacuating the gap between the concave portion and the substrate includes a step of evacuating the gap between the concave portion and the substrate when a distance between a lower surface of the substrate and a bottom surface of the concave portion is greater than 0 mm and equal to or smaller than 20 mm.

18. The method as claimed in claim 13,
wherein the step of selectively evacuating the gap between the substrate receiving area and the substrate includes steps of:
evacuating an exhaust space formed on the other surface of the turntable and separated from the one surface of the turntable, so as to have a first pressure lower than a second pressure in a space on the one surface of the turntable by 1 Pa or lower;
evacuating a gas suction path having one end opened in the one surface of the turntable and the other end capable of being communicated with the exhaust space by evacuating the exhaust space; and
moving the lifting member down so as to place the substrate on the substrate receiving area in parallel with the steps of evacuating the exhaust space and evacuating the gas suction path.

\* \* \* \* \*